(12) United States Patent  (10) Patent No.: US 8,570,052 B1
Mahartya  (45) Date of Patent: Oct. 29, 2013

(54) METHODS AND CIRCUITS FOR MEASURING MUTUAL AND SELF CAPACITANCE

(71) Applicant: Cypress Semiconductor Corporation, San Jose, CA (US)

(72) Inventor: Andriy Mahartya, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/664,421

(22) Filed: Oct. 31, 2012

Related U.S. Application Data

(63) Continuation of application No. 12/606,147, filed on Oct. 26, 2009, now Pat. No. 8,319,505, which is a continuation-in-part of application No. 12/395,462, filed on Feb. 27, 2009, now Pat. No. 8,358,142.

(60) Provisional application No. 61/108,450, filed on Oct. 24, 2008, provisional application No. 61/067,539, filed on Feb. 27, 2008.

(51) Int. Cl.
*G01R 27/26* (2006.01)

(52) U.S. Cl.
USPC .......................................... 324/658; 324/678

(58) Field of Classification Search
None
See application file for complete search history.

(56) References Cited

U.S. PATENT DOCUMENTS

| | | |
|---|---|---|
| 3,660,801 A | 5/1972 | Paulfus |
| 3,921,167 A | 11/1975 | Fox |
| 3,979,745 A | 9/1976 | Bishop |
| 4,039,940 A | 8/1977 | Butler et al. |
| 4,090,092 A | 5/1978 | Serrano |
| 4,103,252 A | 7/1978 | Bobick |
| 4,113,378 A | 9/1978 | Wirtz |
| 4,145,748 A | 3/1979 | Eichelberger et al. |
| 4,193,063 A | 3/1980 | Hitt et al. |
| 4,238,711 A | 12/1980 | Wallot |
| 4,264,903 A | 4/1981 | Bigelow |
| 4,266,144 A | 5/1981 | Bristol |

(Continued)

FOREIGN PATENT DOCUMENTS

| | | |
|---|---|---|
| CN | 101896825 A | 11/2010 |
| EP | 0574213 A | 12/1993 |

(Continued)

OTHER PUBLICATIONS

USPTO Notice of Allowance, U.S. Appl. No. 11/729,818, dated Jun. 9, 2011, 13 pages.

(Continued)

*Primary Examiner* — Minh N Tang

(57) ABSTRACT

An embodiment of a capacitance measurement circuit may include multiple switches, a first node coupled with a first electrode and coupled with at least a first switch of the multiple switches, and a second node coupled with a second electrode and coupled with at least a second switch of the multiple switches, where the multiple switches are configured to reduce an influence of a self-capacitance of the first electrode and a self-capacitance of the second electrode on an output signal during measurement of a mutual capacitance between the first electrode and the second electrode, and where the multiple switches are configured to reduce an influence of the mutual capacitance on the output signal during measurement of at least one of the self-capacitance of the first electrode and the self-capacitance of the second electrode.

20 Claims, 18 Drawing Sheets

(56) References Cited

U.S. PATENT DOCUMENTS

| | | |
|---|---|---|
| 4,283,713 A | 8/1981 | Philipp |
| 4,292,604 A | 9/1981 | Embree et al. |
| 4,293,734 A | 10/1981 | Pepper, Jr. |
| 4,305,135 A | 12/1981 | Dahl et al. |
| 4,438,404 A | 3/1984 | Philipp |
| 4,475,151 A | 10/1984 | Philipp |
| 4,497,575 A | 2/1985 | Philipp |
| 4,558,274 A | 12/1985 | Carusillo |
| 4,560,830 A | 12/1985 | Perl |
| 4,586,260 A | 5/1986 | Baxter et al. |
| 4,614,937 A | 9/1986 | Poujois |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,505 A | 11/1989 | Barrow et al. |
| 4,879,508 A | 11/1989 | Andermo |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson, Jr. |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,373,245 A | 12/1994 | Vranish et al. |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,408,194 A | 4/1995 | Steinbach et al. |
| 5,412,387 A | 5/1995 | Vincelette et al. |
| 5,424,756 A | 6/1995 | Ho et al. |
| 5,461,321 A | 10/1995 | Sanders et al. |
| 5,479,103 A | 12/1995 | Kernahan et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | Lemoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,589,856 A | 12/1996 | Stein et al. |
| 5,629,891 A | 5/1997 | Lemoncheck et al. |
| 5,648,642 A | 7/1997 | Miller et al. |
| 5,650,597 A | 7/1997 | Redmayne |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,691,513 A | 11/1997 | Yamamoto et al. |
| 5,694,063 A | 12/1997 | Burlison et al. |
| 5,730,165 A | 3/1998 | Philipp |
| 5,748,185 A | 5/1998 | Stephan et al. |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand et al. |
| 5,801,340 A | 9/1998 | Peter |
| 5,812,698 A | 9/1998 | Platt et al. |
| 5,841,078 A | 11/1998 | Miller et al. |
| 5,844,256 A | 12/1998 | Mead et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,905,489 A | 5/1999 | Takahama et al. |
| 5,914,465 A | 6/1999 | Allen et al. |
| 5,914,708 A | 6/1999 | Lagrange et al. |
| 5,920,309 A | 7/1999 | Bisset et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,949,264 A | 9/1999 | Lo |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,037,929 A | 3/2000 | Ogura et al. |
| 6,037,930 A | 3/2000 | Wolfe et al. |
| 6,060,957 A | 5/2000 | Kodrnja et al. |
| 6,067,019 A | 5/2000 | Scott |
| 6,097,432 A | 8/2000 | Mead et al. |
| 6,140,853 A | 10/2000 | Lo |
| 6,145,850 A | 11/2000 | Rehm |
| 6,148,104 A | 11/2000 | Wang et al. |
| 6,184,871 B1 | 2/2001 | Teres et al. |
| 6,185,450 B1 | 2/2001 | Seguine et al. |
| 6,188,228 B1 | 2/2001 | Philipp |
| 6,188,391 B1 | 2/2001 | Seely et al. |
| 6,191,723 B1 | 2/2001 | Lewis |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |

(56) References Cited

U.S. PATENT DOCUMENTS

| | | | |
|---|---|---|---|
| 6,271,720 | B1 | 8/2001 | Sevastopoulos |
| 6,271,835 | B1 | 8/2001 | Hoeksma |
| 6,278,283 | B1 | 8/2001 | Tsugai |
| 6,280,391 | B1 | 8/2001 | Olson et al. |
| 6,288,707 | B1 | 9/2001 | Philipp |
| 6,295,052 | B1 | 9/2001 | Kato et al. |
| 6,304,014 | B1 | 10/2001 | England et al. |
| 6,320,184 | B1 | 11/2001 | Winklhofer et al. |
| 6,323,846 | B1 | 11/2001 | Westerman et al. |
| 6,326,859 | B1 | 12/2001 | Goldman et al. |
| 6,342,817 | B1 | 1/2002 | Crofts et al. |
| 6,344,773 | B1 | 2/2002 | Sevastopoulos et al. |
| 6,353,200 | B1 | 3/2002 | Schwankhart |
| 6,366,099 | B1 | 4/2002 | Reddi |
| 6,377,009 | B1 | 4/2002 | Philipp |
| 6,377,129 | B1 | 4/2002 | Rhee et al. |
| 6,380,929 | B1 | 4/2002 | Platt |
| 6,380,931 | B1 | 4/2002 | Gillespie et al. |
| 6,400,217 | B1 | 6/2002 | Bhandari |
| 6,414,671 | B1 | 7/2002 | Gillespie et al. |
| 6,424,338 | B1 | 7/2002 | Anderson |
| 6,430,305 | B1 | 8/2002 | Decker |
| 6,441,073 | B1 | 8/2002 | Tanaka et al. |
| 6,441,682 | B1 | 8/2002 | Vinn et al. |
| 6,445,257 | B1 | 9/2002 | Cox et al. |
| 6,448,911 | B1 | 9/2002 | Somayajula |
| 6,452,514 | B1 | 9/2002 | Philipp |
| 6,457,355 | B1 | 10/2002 | Philipp |
| 6,459,321 | B1 | 10/2002 | Belch |
| 6,466,036 | B1 | 10/2002 | Philipp |
| 6,473,069 | B1 | 10/2002 | Gerpheide |
| 6,476,798 | B1 | 11/2002 | Bertram et al. |
| 6,489,899 | B1 | 12/2002 | Ely et al. |
| 6,490,203 | B1 | 12/2002 | Tang |
| 6,498,720 | B2 | 12/2002 | Glad |
| 6,499,359 | B1 | 12/2002 | Washeleski et al. |
| 6,522,083 | B1 | 2/2003 | Roach |
| 6,522,128 | B1 | 2/2003 | Ely et al. |
| 6,522,187 | B1 | 2/2003 | Sousa |
| 6,523,416 | B2 | 2/2003 | Takagi et al. |
| 6,529,015 | B2 | 3/2003 | Nonoyama et al. |
| 6,534,970 | B1 | 3/2003 | Ely et al. |
| 6,535,200 | B2 | 3/2003 | Philipp |
| 6,570,557 | B1 | 5/2003 | Westerman et al. |
| 6,574,095 | B2 | 6/2003 | Suzuki |
| 6,577,140 | B1 | 6/2003 | Wenman |
| 6,583,632 | B2 | 6/2003 | Von Basse et al. |
| 6,587,093 | B1 | 7/2003 | Shaw et al. |
| 6,597,347 | B1 | 7/2003 | Yasutake |
| 6,610,936 | B2 | 8/2003 | Gillespie et al. |
| 6,614,313 | B2 | 9/2003 | Crofts et al. |
| 6,624,640 | B2 | 9/2003 | Lund et al. |
| 6,639,586 | B2 | 10/2003 | Gerpheide |
| 6,642,857 | B1 | 11/2003 | Schediwy et al. |
| 6,649,924 | B1 | 11/2003 | Philipp et al. |
| 6,667,740 | B2 | 12/2003 | Ely et al. |
| 6,673,308 | B2 | 1/2004 | Hino et al. |
| 6,677,758 | B2 | 1/2004 | Maki et al. |
| 6,677,932 | B1 | 1/2004 | Westerman |
| 6,680,731 | B2 | 1/2004 | Gerpheide et al. |
| 6,683,462 | B2 | 1/2004 | Shimizu |
| 6,690,066 | B1 | 2/2004 | Lin et al. |
| 6,704,005 | B2 | 3/2004 | Kato et al. |
| 6,705,511 | B1 | 3/2004 | Dames et al. |
| 6,714,817 | B2 | 3/2004 | Daynes et al. |
| 6,720,777 | B2 | 4/2004 | Wang |
| 6,730,863 | B1 | 5/2004 | Gerpheide et al. |
| 6,731,121 | B1 | 5/2004 | Hsu et al. |
| 6,744,258 | B2 | 6/2004 | Ishio et al. |
| 6,750,852 | B2 | 6/2004 | Gillespie et al. |
| 6,768,420 | B2 | 7/2004 | McCarthy et al. |
| 6,774,644 | B2 | 8/2004 | Eberlein |
| 6,781,577 | B2 | 8/2004 | Shigetaka |
| 6,788,221 | B1 | 9/2004 | Ely et al. |
| 6,788,521 | B2 | 9/2004 | Nishi |
| 6,798,218 | B2 | 9/2004 | Kasperkovitz |
| 6,806,693 | B1 | 10/2004 | Bron |
| 6,809,275 | B1 | 10/2004 | Cheng et al. |
| 6,810,442 | B1 | 10/2004 | Lin et al. |
| 6,825,673 | B1 | 11/2004 | Yamaoka |
| 6,825,890 | B2 | 11/2004 | Matsufusa |
| 6,829,727 | B1 | 12/2004 | Pawloski |
| 6,838,887 | B2 | 1/2005 | Denen et al. |
| 6,839,052 | B1 | 1/2005 | Kramer |
| 6,856,433 | B2 | 2/2005 | Hatano et al. |
| 6,859,159 | B2 | 2/2005 | Michalski |
| 6,861,961 | B2 | 3/2005 | Sandbach et al. |
| 6,873,203 | B1 | 3/2005 | Latham, II et al. |
| 6,879,215 | B1 | 4/2005 | Roach |
| 6,882,338 | B2 | 4/2005 | Flowers |
| 6,888,536 | B2 | 5/2005 | Westerman et al. |
| 6,888,538 | B2 | 5/2005 | Ely et al. |
| 6,891,531 | B2 | 5/2005 | Lin |
| 6,893,724 | B2 | 5/2005 | Lin et al. |
| 6,897,673 | B2 | 5/2005 | Savage et al. |
| 6,903,402 | B2 | 6/2005 | Miyazawa |
| 6,904,570 | B2 | 6/2005 | Foote et al. |
| 6,914,547 | B1 | 7/2005 | Swaroop et al. |
| 6,933,873 | B1 | 8/2005 | Horsley et al. |
| 6,940,291 | B1 | 9/2005 | Ozick |
| 6,946,853 | B2 | 9/2005 | Gifford et al. |
| 6,949,811 | B2 | 9/2005 | Miyazawa |
| 6,949,937 | B2 | 9/2005 | Knoedgen |
| 6,958,594 | B2 | 10/2005 | Redl et al. |
| 6,969,978 | B2 | 11/2005 | Dening |
| 6,970,120 | B1 | 11/2005 | Bjornsen |
| 6,970,126 | B1 | 11/2005 | O'Dowd et al. |
| 6,975,123 | B1 | 12/2005 | Malang et al. |
| 6,993,607 | B2 | 1/2006 | Philipp |
| 6,999,009 | B2 | 2/2006 | Monney |
| 7,002,557 | B2 | 2/2006 | Iizuka et al. |
| 7,006,078 | B2 | 2/2006 | Kim |
| 7,006,938 | B2 | 2/2006 | Laraia et al. |
| 7,030,782 | B2 | 4/2006 | Ely et al. |
| 7,030,860 | B1 | 4/2006 | Hsu et al. |
| 7,031,886 | B1 | 4/2006 | Hargreaves |
| 7,032,051 | B2 | 4/2006 | Reay et al. |
| 7,046,230 | B2 | 5/2006 | Zadesky et al. |
| 7,068,039 | B2 | 6/2006 | Parker |
| 7,075,316 | B2 | 7/2006 | Umeda et al. |
| 7,075,864 | B2 | 7/2006 | Kakitsuka et al. |
| 7,078,916 | B2 | 7/2006 | Denison |
| 7,098,675 | B2 | 8/2006 | Inaba et al. |
| 7,109,978 | B2 | 9/2006 | Gillespie et al. |
| 7,119,550 | B2 | 10/2006 | Kitano et al. |
| 7,129,714 | B2 | 10/2006 | Baxter |
| 7,129,935 | B2 | 10/2006 | Mackey |
| 7,133,140 | B2 | 11/2006 | Lukacs et al. |
| 7,133,793 | B2 | 11/2006 | Ely et al. |
| 7,136,051 | B2 | 11/2006 | Hein et al. |
| 7,141,968 | B2 | 11/2006 | Hibbs et al. |
| 7,141,987 | B2 | 11/2006 | Hibbs et al. |
| 7,148,704 | B2 | 12/2006 | Philipp |
| 7,151,276 | B2 | 12/2006 | Gerlach et al. |
| 7,151,528 | B2 | 12/2006 | Taylor et al. |
| 7,158,056 | B2 | 1/2007 | Wright et al. |
| 7,158,125 | B2 | 1/2007 | Sinclair et al. |
| 7,202,655 | B2 | 4/2007 | Itoh |
| 7,202,857 | B2 | 4/2007 | Hinckley et al. |
| 7,205,777 | B2 | 4/2007 | Schulz et al. |
| 7,212,189 | B2 | 5/2007 | Shaw et al |
| 7,224,591 | B2 | 5/2007 | Kaishita et al. |
| 7,225,090 | B2 | 5/2007 | Coley |
| 7,233,508 | B2 | 6/2007 | Itoh |
| 7,235,983 | B2 | 6/2007 | O'Dowd et al. |
| 7,245,131 | B2 | 7/2007 | Kurachi et al. |
| 7,253,643 | B1 | 8/2007 | Seguine |
| 7,254,775 | B2 | 8/2007 | Geaghan et al. |
| 7,256,588 | B2 | 8/2007 | Howard et al. |
| 7,262,609 | B2 | 8/2007 | Reynolds |
| 7,271,608 | B1 | 9/2007 | Vermeire et al. |
| 7,288,946 | B2 | 10/2007 | Hargreaves et al. |
| 7,288,977 | B2 | 10/2007 | Stanley |
| 7,298,124 | B2 | 11/2007 | Kan et al. |

(56) References Cited

U.S. PATENT DOCUMENTS

| | | |
|---|---|---|
| 7,301,350 B2 | 11/2007 | Hargreaves et al. |
| 7,307,485 B1 | 12/2007 | Snyder et al. |
| 7,312,616 B2 | 12/2007 | Snyder |
| 7,323,879 B2 | 1/2008 | Kuo et al. |
| 7,323,886 B2 | 1/2008 | Lee |
| 7,333,090 B2 | 2/2008 | Tanaka et al. |
| 7,339,580 B2 | 3/2008 | Westerman et al. |
| 7,359,816 B2 | 4/2008 | Kumar et al. |
| 7,375,535 B1 | 5/2008 | Kutz et al. |
| 7,381,031 B2 | 6/2008 | Kawaguchi et al. |
| 7,392,431 B2 | 6/2008 | Swoboda |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,439,962 B2 | 10/2008 | Reynolds et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,515,140 B2 | 4/2009 | Philipp |
| 7,521,941 B2 | 4/2009 | Ely et al. |
| RE40,867 E | 8/2009 | Binstead |
| 7,598,752 B2 | 10/2009 | Li |
| 7,598,822 B2 | 10/2009 | Rajagopal et al. |
| 7,663,607 B2 | 2/2010 | Hotelling et al. |
| 7,667,468 B1 | 2/2010 | Anderson |
| 7,683,641 B2 | 3/2010 | Hargreaves et al. |
| 7,804,307 B1 | 9/2010 | Bokma et al. |
| 7,812,827 B2 | 10/2010 | Hotelling et al. |
| 7,812,829 B2 | 10/2010 | Gillespie et al. |
| 7,821,274 B2 | 10/2010 | Philipp et al. |
| 7,831,070 B1 | 11/2010 | Cheng et al. |
| 7,911,456 B2 | 3/2011 | Gillespie et al. |
| 7,932,897 B2 | 4/2011 | Elias et al. |
| 8,040,142 B1 | 10/2011 | Bokma et al. |
| 8,040,321 B2 | 10/2011 | Peng et al. |
| 8,054,299 B2 | 11/2011 | Krah |
| 8,068,097 B2 | 11/2011 | Guanghai |
| 8,072,429 B2 | 12/2011 | Grivna |
| 8,082,566 B2 | 12/2011 | Stallings |
| 8,089,288 B1 | 1/2012 | Maharita |
| 8,089,289 B1 | 1/2012 | Kremin et al. |
| 8,093,914 B2 | 1/2012 | Maharyta et al. |
| 8,094,128 B2 | 1/2012 | Vu et al. |
| 8,144,125 B2 | 3/2012 | Peng et al. |
| 8,144,126 B2 | 3/2012 | Wright |
| 8,169,238 B1 | 5/2012 | Maharyta et al. |
| 2001/0012667 A1 | 8/2001 | Ma et al. |
| 2002/0000978 A1 | 1/2002 | Gerpheide |
| 2002/0063688 A1 | 5/2002 | Shaw et al. |
| 2002/0067348 A1 | 6/2002 | Masters et al. |
| 2002/0109035 A1 | 8/2002 | Denen et al. |
| 2002/0136372 A1 | 9/2002 | Bozorgui-Nesbat |
| 2002/0140440 A1 | 10/2002 | Haase |
| 2002/0191029 A1 | 12/2002 | Gillespie et al. |
| 2003/0014239 A1 | 1/2003 | Ichbiah et al. |
| 2003/0025679 A1 | 2/2003 | Taylor et al. |
| 2003/0062889 A1 | 4/2003 | Ely et al. |
| 2003/0063073 A1 | 4/2003 | Geaghan et al. |
| 2003/0063428 A1 | 4/2003 | Nishi |
| 2003/0076306 A1 | 4/2003 | Zadesky et al. |
| 2003/0080755 A1 | 5/2003 | Kobayashi |
| 2003/0091220 A1 | 5/2003 | Sato et al. |
| 2003/0098858 A1 | 5/2003 | Perski et al. |
| 2003/0112021 A1 | 6/2003 | Palata et al. |
| 2003/0156098 A1 | 8/2003 | Shaw et al. |
| 2003/0160808 A1 | 8/2003 | Foote et al. |
| 2003/0178675 A1 | 9/2003 | Nishizaka et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2003/0189419 A1 | 10/2003 | Maki et al. |
| 2003/0230438 A1 | 12/2003 | Keefer et al. |
| 2003/0232507 A1 | 12/2003 | Chen |
| 2004/0041798 A1 | 3/2004 | Kim |
| 2004/0056845 A1 | 3/2004 | Harkcom et al. |
| 2004/0068409 A1 | 4/2004 | Tanaka et al. |
| 2004/0082198 A1 | 4/2004 | Nakamura et al. |
| 2004/0169594 A1 | 9/2004 | Ely et al. |
| 2004/0178989 A1 | 9/2004 | Shahoian et al. |
| 2004/0178997 A1 | 9/2004 | Gillespie et al. |
| 2004/0183560 A1 | 9/2004 | Savage et al. |
| 2004/0217945 A1 | 11/2004 | Miyamoto et al. |
| 2004/0239616 A1 | 12/2004 | Collins |
| 2004/0239650 A1 | 12/2004 | Mackey |
| 2004/0252109 A1 | 12/2004 | Trent et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0031175 A1 | 2/2005 | Hara et al. |
| 2005/0062732 A1 | 3/2005 | Sinclair et al. |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2005/0099188 A1 | 5/2005 | Baxter |
| 2005/0159126 A1 | 7/2005 | Wang |
| 2005/0169768 A1 | 8/2005 | Kawaguchi et al. |
| 2005/0179668 A1 | 8/2005 | Edwards |
| 2005/0270273 A1 | 12/2005 | Marten |
| 2005/0275382 A1 | 12/2005 | Stessman et al. |
| 2005/0280639 A1 | 12/2005 | Taylor et al. |
| 2005/0283330 A1 | 12/2005 | Laraia et al. |
| 2006/0022660 A1 | 2/2006 | Itoh |
| 2006/0026535 A1 | 2/2006 | Hotelling et al. |
| 2006/0032680 A1 | 2/2006 | Elias et al. |
| 2006/0033508 A1 | 2/2006 | Lee |
| 2006/0033724 A1 | 2/2006 | Chaudhri et al. |
| 2006/0038793 A1 | 2/2006 | Philipp |
| 2006/0049834 A1 | 3/2006 | Umeda |
| 2006/0053387 A1 | 3/2006 | Ording |
| 2006/0066582 A1 | 3/2006 | Lyon et al. |
| 2006/0066585 A1 | 3/2006 | Lin |
| 2006/0097991 A1 | 5/2006 | Hotelling et al. |
| 2006/0097992 A1 | 5/2006 | Gitzinger et al. |
| 2006/0108349 A1 | 5/2006 | Finley et al. |
| 2006/0113974 A1 | 6/2006 | Kan et al. |
| 2006/0114247 A1 | 6/2006 | Brown |
| 2006/0139469 A1 | 6/2006 | Yokota et al. |
| 2006/0152739 A1 | 7/2006 | Silvestre |
| 2006/0164142 A1 | 7/2006 | Stanley |
| 2006/0172767 A1 | 8/2006 | Cathey et al. |
| 2006/0176718 A1 | 8/2006 | Itoh |
| 2006/0187214 A1 | 8/2006 | Gillespie et al. |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0221061 A1 | 10/2006 | Fry |
| 2006/0227117 A1 | 10/2006 | Proctor |
| 2006/0232559 A1 | 10/2006 | Chien et al. |
| 2006/0256090 A1 | 11/2006 | Huppi |
| 2006/0258390 A1 | 11/2006 | Cui et al. |
| 2006/0262101 A1 | 11/2006 | Layton et al. |
| 2006/0267953 A1 | 11/2006 | Peterson et al. |
| 2006/0273804 A1* | 12/2006 | Delorme et al. .............. 324/658 |
| 2006/0290678 A1 | 12/2006 | Lii |
| 2007/0046299 A1 | 3/2007 | Hargreaves et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0132737 A1 | 6/2007 | Mulligan et al. |
| 2007/0152983 A1 | 7/2007 | Mckillop et al. |
| 2007/0164756 A1 | 7/2007 | Lee |
| 2007/0173220 A1 | 7/2007 | Kim et al. |
| 2007/0176609 A1 | 8/2007 | Ely et al. |
| 2007/0176903 A1 | 8/2007 | Dahlin et al. |
| 2007/0228256 A1 | 10/2007 | Mentzer et al. |
| 2007/0229469 A1 | 10/2007 | Seguine |

(56) References Cited

U.S. PATENT DOCUMENTS

| | | | |
|---|---|---|---|
| 2007/0236478 | A1 | 10/2007 | Geaghan et al. |
| 2007/0257894 | A1 | 11/2007 | Philipp |
| 2007/0263191 | A1 | 11/2007 | Shibazaki |
| 2007/0268243 | A1 | 11/2007 | Choo et al. |
| 2007/0268265 | A1 | 11/2007 | Xiaoping |
| 2007/0268273 | A1 | 11/2007 | Westerman et al. |
| 2007/0268274 | A1 | 11/2007 | Westerman et al. |
| 2007/0268275 | A1 | 11/2007 | Westerman et al. |
| 2007/0273659 | A1 | 11/2007 | Xiaoping et al. |
| 2007/0291013 | A1 | 12/2007 | Won |
| 2007/0296709 | A1 | 12/2007 | Guanghai |
| 2008/0007529 | A1 | 1/2008 | Paun et al. |
| 2008/0007534 | A1 | 1/2008 | Peng et al. |
| 2008/0024455 | A1 | 1/2008 | Lee et al. |
| 2008/0036473 | A1 | 2/2008 | Jansson |
| 2008/0041639 | A1 | 2/2008 | Westerman et al. |
| 2008/0041640 | A1 | 2/2008 | Gillespie et al. |
| 2008/0042986 | A1 | 2/2008 | Westerman et al. |
| 2008/0042987 | A1 | 2/2008 | Westerman et al. |
| 2008/0042988 | A1 | 2/2008 | Westerman et al. |
| 2008/0042989 | A1 | 2/2008 | Westerman et al. |
| 2008/0042994 | A1 | 2/2008 | Gillespie et al. |
| 2008/0047764 | A1 | 2/2008 | Lee |
| 2008/0048997 | A1 | 2/2008 | Gillespie et al. |
| 2008/0062139 | A1 | 3/2008 | Hotelling et al. |
| 2008/0062140 | A1 | 3/2008 | Hotelling et al. |
| 2008/0068100 | A1 | 3/2008 | Goodnow et al. |
| 2008/0072192 | A1 | 3/2008 | Lenahan |
| 2008/0088595 | A1 | 4/2008 | Liu et al. |
| 2008/0111714 | A1 | 5/2008 | Kremin |
| 2008/0116904 | A1 | 5/2008 | Reynolds et al. |
| 2008/0128182 | A1 | 6/2008 | Westerman et al. |
| 2008/0150906 | A1 | 6/2008 | Grivna |
| 2008/0158178 | A1 | 7/2008 | Hotelling et al. |
| 2008/0162997 | A1 | 7/2008 | Vu et al. |
| 2008/0165134 | A1 | 7/2008 | Krah |
| 2008/0179112 | A1 | 7/2008 | Qin et al. |
| 2008/0196945 | A1 | 8/2008 | Konstas |
| 2008/0250864 | A1 | 10/2008 | Shipton |
| 2008/0266263 | A1 | 10/2008 | Motaparti et al. |
| 2008/0278178 | A1 | 11/2008 | Philipp |
| 2009/0002206 | A1 | 1/2009 | Kremin |
| 2009/0096758 | A1 | 4/2009 | Hotelling et al. |
| 2009/0153152 | A1 | 6/2009 | Maharyta et al. |
| 2009/0322351 | A1 | 12/2009 | Mcleod |
| 2010/0001973 | A1 | 1/2010 | Hotelling et al. |
| 2010/0328262 | A1 | 12/2010 | Huang et al. |
| 2011/0025629 | A1 | 2/2011 | Grivna et al. |
| 2011/0234523 | A1 | 9/2011 | Chang et al. |
| 2012/0043140 | A1 | 2/2012 | Peterson et al. |
| 2012/0043971 | A1 | 2/2012 | Maharyta |
| 2012/0043973 | A1* | 2/2012 | Kremin .................. 324/658 |
| 2013/0049771 | A1 | 2/2013 | Peng et al. |

FOREIGN PATENT DOCUMENTS

| | | |
|---|---|---|
| GB | 05000604 B2 | 2/2005 |
| JP | 04012528 | 1/1992 |
| JP | 0528351981 | 10/1993 |
| JP | 6104334 A | 4/1994 |
| JP | 6163528 A | 6/1994 |
| KR | 1020100135220 | 12/2010 |
| TW | 200946926 A | 11/2009 |
| WO | 0002188 A | 1/2000 |

OTHER PUBLICATIONS

USPTO Notice of Allowance, U.S. Appl. No. 11/729,818, dated Oct. 5, 2010, 33 pages.
USPTO Notice of Allowance, U.S. Appl. No. 11/729,818, dated Jun. 25, 2010, 7 pages.
USPTO Notice of Allowance, U.S. Appl. No. 11/823,982, dated May 14, 2010, 8 pages.
USPTO Notice of Allowance, U.S. Appl. No. 13/047,62, dated Apr. 11, 2012, 19 pages.
USPTO Requirement for Restriction for U.S. Appl. No. 12/167,100 dated Aug. 20, 2010; 6 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
USPTO Requirement for Restriction for U.S. Appl. No. 12/395,462 dated May 13, 2011; 6 pages.
USPTO Requirement for Restriction/Election for U.S. Appl. No. 11/337,272 dated Aug. 11, 2006; 5 pages.
USPTO Requirement Restriction for U.S. Appl. No. 11/824,249 dated Feb. 17, 2011: 5 pages.
USPTO Restriction Requirement, U.S. Appl. No. 11/601,465; dated Nov. 1, 2007, 5 pages.
USPTO Restriction Requirement, U.S. Appl. No. 13/047,620, dated Feb. 27, 2012; 7 pages.
Van Ess, David; "Simulating a 555 Timer with PSoC," Cypress Semiconductor Corporation, Application Note AN2286, May 19, 2005, 10 pages.
Vladislav Golub, PhD., "Sigma-Delta ADCs", pub. date: Jul. 2003, 10 pages.
Wikipedia, The Free Encyclopedia, "IBM PC Keyboard," <http://en.wikipedia.org/wiki/PC_keyboard> accessed , May 19, 2006, 3 pages.
Written Opinion of the International Searching Authority for International Application No. PCT/US08/60696 mailed Sep. 22, 2008; 4 pages.
"CSD User Module Data Sheet," CSD v1.0. Oct. 23, 2006; 58 pages.
"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006: 4 pages.
Andrew S. Tanebaum with contributions from James R. Goodman, "Structured Computer Organization", 1999, Prentice Hall, Fourth Edition, pp. 261-288, 359-362.
U.S. Appl. No. 12/861,812 "Capacitance Measurement Systems and Methods", filed Aug. 23, 2010, 24 pages.
U.S. Appl. No. 13/047,620 "Touch Detection Techniques for Capacitive Touch Sense Systems", filed Mar. 14, 2011, 38 pages.
U.S. Appl. No. 13/191,806 "Capacitance Measurement Systems and Methods", filed Jul. 27, 2011, 38 pages.
U.S. Appl. No. 13/049,798: "Capacitance to Code Converter With Sigma-Delta Modulator," Kremin, filed Mar. 16, 2011; 77 pages.
U.S. Appl. No. 11/493,350: "Technique for Increasing the Sensitivity of Capacitive Sensor Arrays," Lee et al., filed Jul. 25, 2006: 48 pages.
U.S. Appl. No. 11/600,255: "Capacitance to Code Converter With Sigma-Delta Modulator," Kremin, filed Nov. 14, 2006; 102 pages.
U.S. Appl. No. 11/709,897 : "Preventing Unintentional Activation of a Sensor Element of a Sensing Device," Jason Konstas, flied Feb. 21, 2007; 97 pages.
U.S. Appl. No. 12/040,367: "Touch Sensing," Peterson et al., filed Feb. 29, 2008; 26 pages.
U.S. Appl. No. 12/166,228 "Capacitance to frequency converter"Andriy Mahayta et al., filed Jul. 1, 2008; 29 pages.
U.S. Appl. No. 12/197,466: "Radical Oxidation Process for Fabricating a Nonvolatile Charge Trap Memory Device," Ramkumar et al., filed Aug. 25, 2008; 68 pages.
U.S. Appl. No. 12/239,692 "System and Method to Measure Capacitance of Capacitive Sensor Array" Nathan Moyal et al., filed Sep. 26, 2008; 34 pages.
U.S. Appl. No. 12/332,980: "Compensation Circuit for a TX-RX Capacitive Sensor," Andriy Maharyta, filed Dec. 11, 2008; 55 pages.
U.S. Appl. No. 12/380,141: "Capacitive field sensor wth sigma-delta modulator," Rystun et al., filed Feb. 23, 2009; 48 pages.
U.S. Appl. No. 12/395,462: "Methods and Circuits for Measuring Mutual and Self Capacitance," Andriy Maharyta, filed Feb. 27, 2009; 44 pages.
U.S. Appl. No. 12/395,969: "Multi-Touch Sensing Method," Dana Olson, file Mar. 2, 2009; 22 pages.

(56) References Cited

OTHER PUBLICATIONS

U.S. Appl. No. 12/806,147: "Methods and Circuits for Measuring Mutual and Self Capacitance," Andriy Maharyta, filed Oct. 26, 2009; 49 pages.
U.S. Appl. No. 12/618,861: "Automatic Tuning of a Capacitive Sensing Device," Dana Olson, filed Nov. 13, 2009 30 pages.
U.S. Appl. No. 13/047,035: "Apparatus and Method for Reducing Average Scan Rate to Detect a Conductive Object on a Sensing Device," Tao Peng, filed Mar. 14, 2011; 64 pages.
U.S. Appl. No. 13/345,504 "Compensation Circuit for a TX-RX Capacitive Sensor", filed Jan. 6, 2012, 56 pages.
U.S. Appl. No. 13/612,803: "Capacitive Field Sensor with Sigma-Delta Modulator ," Andriy Ryshtun, filed Sep. 12, 2012; 56 pages.
U.S. Appl. No. 13/670,671: "System and Method to Measure Capacitance of Capacitive Sensor Array," Nathan Y. Moyal, filed Nov. 7, 2012; 40 pages.
U.S. Appl. No. 13/671,389: "Touch Sensing," Jonathan R. Peterson, filed Nov. 7, 2012; 35 jpages.
U.S. Appl. No. 13/720,861: "Methods and Circuits for Measuring Mutual and Self Capacitance," Andriy Maharyta, filed Dec. 19, 2012; 38 pages.
U.S. Appl. No. 60/220,021: "Method for Automatically Tuning a Capacitive Sensing Device," Dana Olson, filed Jun. 26, 2009; 13 pages.
U.S. Appl. No. 60/947,865: "Capacitive Field Sensor with Sigma-Delt Modulator," Viktor Kremin, filed Jul. 3, 2007; 33 pages.
U.S. Appl. No. 60/947,871 "Capacitance to Frequency Converter,"Andrey Maharita et al., filed Jul. 3, 2007; 21 pages.
U.S. Appl. No. 61/013,986: "Compensation Circuit for a TX-RX Capacitive Sensor" Viktor Kremin et al., filed Dec. 14, 2007; 4 pages.
U.S. Appl. No. 61/016,123 "Capacitive Field Sensor With Sigma-Delta Modulator" filed Dec. 21, 2007, 23 pages.
U.S. Appl. No. 61/023,988: "Touch Sensing" Jon Peterson, et al., filed Jan. 28, 2008; 26 pages.
U.S. Appl. No. 61/024,158 "Multi-Touch Sensing Method With Differential Input" Dana Olson et al., filed Jan. 28, 2008; 19 pages.
U.S. Appl. No. 61/030,526: "Capacitive Sensing Universal System and Method," Andriy Ryshtun, filed Feb. 21, 2008; 22 pages.
U.S. Appl. No. 61/067,539 "Methods and Circuits to Measuring Mutual and So Capacitance" Andriy Maharyta et al., filed Feb. 27, 2008: 40 pages.
U.S. Appl. No. 61/067,743 "Multi-Touch Sensing Method with Differential Input" Dana Olson et al., filed Feb. 29, 2008, 19 pages.
U.S. Appl. No. 13/342,942 "Capacitive Field Sensor With Sigma-Delta Modulator", filed Jan. 3, 2012, 37 pages.
Application No. PCT/US08/13622: "Compensation Circuit for a TX-RX Capacitive Sensor", Andriy Maharyta et al., filed Dec. 28, 2008; 53 pages.
Chapweske, Adam "The PS/2 Mouse Interface," PS/2 Mouse Interfacing, 2001, retrieved on May 18, 2006; 11 pages.
Chris Mack, "Semiconductor Lithography—The Basic Process," Gentleman Scientist, downloaded Apr. 20, 2006, http://www.lithoguru.com/scientist/lithobasics.html; 12 pages.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "Fan Controller CG6457AM and CG6462AM," PSoC Mixed Signal Array Preliminary Data Sheet May 24, 2005; 25 pages.
Cypress Semiconductor Corporation, "PSoC CY8C28x34 Technical Reference Manual (TRM)," PSoC CY8C20x34 TRM, Version 1.0, 2006; 218 pages.
Cypress Semiconductor Corporation, "PSoC Mixed-Signal Controllers," Production Description; <http://www.cypress.com/portal/server>; retrieved on Sep. 27; 2005; 2 pages.
Cypress Semiconductor Corporation, "Release Notes srn017," Jan. 24, 2007; 3 pages.

Dave Van Ess, "Understanding Switched Capacitor Analog Blocks," Application Note AN2041, Mar. 30, 2004, 16 pages.
Dennis Seguine, "Capacitive Switch Scan," AN2233a, Application Note, CY8C21x34, Apr. 7, 2005; 6 pages.
International Search Report and Written Opinion Application No. PCT/US08/06627 dated Aug. 26, 2008; 8 pages.
International Search Report for International Application No. PCT/US05/23468 dated Aug. 25, 2006; 2 pages.
International Search Report of the International Searching Authority for International Application No. PCT/US08/13622 dated Feb. 9, 2009; 2 pages.
International Search Report of the International Searching Authority, dated Feb. 9, 2009 for International Application No. PCTUS2008/013622; 2 pages.
International Written Opinion of the International Searching Authority for International Application No. PCT/US08/13622 dated Feb. 9, 2009; 5 pages.
International Written Opinion of the International Searching Authority, dated Feb. 9, 2009 for International Application No. PCT/US2008/013622; 5 pages.
Janusz Miodzianowski, "A Simple Multipurpose Logic Analyzer," Dec. 1997, Circuit Cellar Ink, Issue 89, pp. 28-36.
Kremin. V. "Noise resistant capacitive sensor," US Patent Application Serial No. 11/8244249, filed Jun. 29, 2007; 41 pages.
Larry K Baxter "Capactive Sensors, Design and Applications," IEEE Press, The Institute of Electrical and Electronics Engineers Inc., Aug. 1996, pp. 177-187; 12 pages.
Lee, Mark; "EMC Design Considerations for PSoC CapSense Applications," Cypress Semiconductor Corporation, Apptication Note AN2318; Sep. 16, 2005; 6 pages.
Mark Lee, "CapSense Best Practices," Cypress Semiconductor Application Note, Oct. 16, 2006; 10 pages.
Milton Ohring, "The Materials Science of Thin Films: Deposition and Structure." 2nd Edition, Academic Press, 2002, pp. 336-337; 4 pages.
Min et al "Offset Compensation of Capacitive Sensors for Electrostatic Microactuators," ISIE 2001, Pusan Korea, pp. 2114-2117.
U.S. Appl. No. 61/108,450: "Alternative Realizatons of the CSX (TxRx-1) Sensng Scheme for ITO Panels," Andriy Maharyta, filed Oct. 24, 2008; 7 pages.
Ryan Seguine et al, "Layout Guidelines for PSoC CapSense", Cypress Application Note AN2292, Revision B, Oct. 31, 2005; all pages.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Sedra, Adel S. et al., "Microelectronic:, Circuits," 3rd Edition, Oxford University Press, pp. xiii-xx and 861-883, 1991: 20 pages.
Seguine, Ryan: "Layout Guidelines for PSoC CapSense," Cypress Semiconductor Corporation, Application Note AN2292; Jul. 22; 2005; 13 pages.
SIPO 1st Office Action for Application No. 200880120802.9 dated Nov. 5, 2012; 6 pages.
Ted Tsui "Migrating from CSR to CSD," Cypress Semiconductor Corporation, Application Note AN2408, Feb. 8, 2007, http://www.cypress.com
The Authoritative Dictionary of IEEE Standards Terms, 2000, IEEE Press Publications, 7th Edition, pp. 1133-1134; 4 pages.
The Written Opinion of the International Searching Authority for International Application No. PCT/US05/23468 dated Aug. 25, 2006; 7 pages.
USPTO Advisory Action for U.S. Appl. No. 11/230,719 dated Nov. 30, 2007; 3 pages.
USPTO Advisory Action for U.S. Appl. No. 11/337,272 dated Apr. 3, 2007; 3 pages.
USPTO Advisory Action for U.S. Appl. No. 11/395,417 dated Jul. 6, 2007; 3 pages.
USPTO Advisory Action for U.S. Appl. No. 11/437,517 dated Apr. 7, 2010; 3 pages.
USPTO Advisory Action for U.S. Appl. No. 11/442,212 dated Jan. 5, 2011; 3 pages.

(56) References Cited

OTHER PUBLICATIONS

USPTO Advisory Action for U.S. Appl. No. 11/442,212 dated Dec. 17, 2009; 3 pages.
USPTO Advisory Action for U.S. Appl. No. 11/477,179 dated Jun. 7, 2010; 3 pages.
USPTO Advisory Action for U.S. Appl. No. 11/512,042 dated Feb. 23, 2011; 3 pages.
USPTO Advisory Action for U.S. Appl. No. 12/332,980 dated Aug. 9, 2011; 3 pages.
USPTO Advisory Action for U.S. Appl. No. 12/367,279 dated Jun. 25, 2010; 3 pages.
USPTO Advisory Action for U.S. Appl. No. 12/395,462 dated Mar. 28, 2012; 2 pages.
USPTO Advisory Action for U.S. Appl. No. 12/395,969 dated Sep. 21, 2012; 3 pages.
USPTO Final Rejection for U.S. Appl. No. 09/975,105 dated Jul. 13, 2006, 7 pages.
USPTO Final Rejection for U.S. Appl. No. 11/230,719 dated Sep. 7, 2007; 9 pages.
USPTO Final Rejection for U.S. Appl. No. 11/273,708 dated Jul. 5, 2007; 8 pages.
USPTO Final Rejection for U.S. Appl. No. 11/337,272 dated Feb. 2, 2007; 11 pages.
USPTO Final Rejection for U.S. Appl. No. 11/395,417 dated Apr. 24, 2007; 9 pages.
USPTO Final Rejection for U.S. Appl. No. 11/437,517 dated Jan. 26, 2010; 11 pages.
Final Rejection for U.S. Appl. No. 11/442,212 dated Jun. 7, 2011; 14 pages.
USPTO Final Rejection for U.S. Appl. No. 11/442,212 dated Oct. 2, 2009; 12 pages.
USPTO Final Rejection for U.S. Appl. No. 11/442,212 dated Oct. 13, 2010; 13 pages.
USPTO Final Rejection for U.S. Appl. No. 11/477,179 dated Apr. 1, 2010; 10 pages.
USPTO Final Rejection for U.S. Appl. No. 11/477,179 dated Nov. 24, 2010; 10 pages.
USPTO Final Rejection for U.S. Appl. No. 11/484,085 dated Mar. 16, 2010; 7 pages.
USPTO Final Rejection for U.S. Appl. No. 11/502,267 dated Feb. 3, 2009; 10 pages.
USPTO Final Rejection for U.S. Appl. No. 11/512,042 dated Dec. 21, 2010; 7 pages.
USPTO Final Rejection for U.S. Appl. No. 11/600,896 dated Sep. 30, 2010; 19 pages.
USPTO Final Rejection for U.S. Appl. No. 11/709,897 dated Jul. 29, 2010; 24 pages.
USPTO Final Rejection for U.S. Appl. No. 11/983,291 dated Aug. 12, 2009; 10 pages.
USPTO Final Rejection for U.S. Appl. No. 12/040,387 dated Nov. 21, 2011; 13 pages.
USPTO Final Rejection for U.S. Appl. No. 12/166,228 dated Jan. 4, 2011; 9 pages.
USPTO Final Rejection for U.S. Appl. No. 12/166,228 dated May 28, 2010; 12 pages.
USPTO Final Rejection for U.S. Appl. No. 12/239,692 dated May 9, 2011; 10 pages.
USPTO Final Rejection for U.S. Appl. No. 12/332,980 dated May 31, 2011; 11 pages.
USPTO Final Rejection for U.S. Appl. No. 12/367,279 dated Apr. 1, 2010; 6 pages.
USPTO Final Rejection for U.S. Appl. No. 12/395,462 dated Jan. 3, 2012; 6 pages.
USPTO Final Rejection for U.S. Appl. No. 12/395,969 dated Jul. 17, 2012; 25 pages.
USPTO Final Rejection for U.S. Appl. No. 12/606,147 dated Jan. 4, 2012; 6 pages.
USPTO Final Rejection, U.S. Appl. No. 11/601,465, dated Mar. 6, 2009, 13 pages.
USPTO Final Rejection, U.S. Appl. No. 11/601,465, dated Jul. 9, 2008, 16 pages.
USPTO Final Rejection, U.S. Appl. No. 11/729,818, dated Jul. 2, 2009, 14 pages.
USPTO Final Rejection, U.S. Appl. No. 11/824,249, dated Dec. 22, 2011, 10 pages.
USPTO Final Rejection, U.S. Appl. No. 12/861,812, dated Oct. 18, 2011, 16 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Non-Final Rejection for U.S. Appl. No. 11/273,708 dated Mar. 19, 2007; 16 pages.
USPTO Non-Final Rejection for U.S Appl. No. 11/337,272 dated May 17, 2007, 11 pages.
USPTO Non-Final Rejection for U.S. App. No. 11/337,272 dated Oct. 24, 2006: 9 pages.
USPTO Non-Final Rejection for U.S. Appl. No. 11/395,417 dated Apr. 25, 2008; 7 pages.
USPTO Non-Final Rejection for U.S. Appl. No. 11/395,417 dated Oct. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010; 10 pages.
USPTO Non-Final Rejection for U.S. Appl. No. 11/437,517 dated Aug. 5, 2009; 9 pages.
USPTO Non-Final Rejection for U.S. Appl. No. 11/442,212 dated Feb. 25, 2011; 13 pages.
USPTO Non-Final Rejection for U.S. Appl. No. 11/442,212 dated Mar. 31, 2009; 12 pages.
USPTO Non-Final Rejection for U.S. Appl. No. 11/442,212 dated Jul. 6, 2010; 13 pages.
USPTO Non-Final Rejection for U.S. Appl. No. 11/477,179 dated Jun. 9, 2009; 13 pages.
USPTO Non-Final Rejectiol for U.S. Appl. No. 11/477,179 dated Jul. 20, 2010, 10 pages.
USPTO Non-Final Rejection for U.S. Appl. No. 11/477,179 dated Nov. 18, 2009; 10 pages.
USPTO Non-Final Rejection for U.S. Appl. No. 11/484,085 dated Sep. 17, 2009; 8 pages.
USPTO Non-Finat Rejection for U.S. Appl. No. 11/493,350 dated Jun. 16, 2010; 8 pages.
USPTO Non-Final Rejection for U.S. Appl. No. 11/493,350 dated Nov. 9, 2010; 9 pages.
USPTO Non-Final Rejection for U.S. Appl. No. 11/502,267 dated Aug. 11, 2008; 10 pages.
USPTO Non-Final Rejection for U.S. Appl. No. 11/600,255 dated Mar. 29, 2010; 10 pages.
USPTO Non-Final Rejection for U.S. Appl. No. 11/600,696 dated May 14, 2010; 15 pages.
USPTO Non-Final Rejection for U.S. Appl. No. 11/600,896 dated Dec. 16, 2009; 13 pages.
USPTO Non-Final Rejection for U.S. Appl. No. 11/700,314 dated Mar. 26, 2010, 7 pages.
USPTO Non-Final Rejection for U.S. Appl. No. 11/709,897 dated Feb. 16, 2010; 21 pages.
USPTO Non-Final Rejection for U.S. Appl. No. 11/729,818 dated Dec. 17, 2008; 12 pages.
USPTO Non-Final Rejection for U.S. Appl. No. 11/823,982 dated Mar. 19, 2009; 14 pages.
USPTO Non-Final Rejection for U.S. Appl. No. 11/824,249 dated May 25, 2011; 9 pages.

(56) References Cited

OTHER PUBLICATIONS

USPTO Non-Final Rejection for U.S. Appl. No. 11/880,963 dated Jun. 12, 2009; 10 pages.
USPTO Non-Final Rejection for U.S. Appl. No. 11/967,243 dated Sep. 17, 2009; 9 pages.
USPTO Non-Final Rejection for U.S. Appl. No. 11/983,291 dated Mar. 9, 2009; 9 pages.
USPTO Non-Final Rejection for U.S. Appl. No. 12/040,387 dated Jun. 30, 2011; 12 pages.
USPTO Non-Final Rejection for U.S. Appl. No. 12/166,228 dated Aug. 11, 2010; 8 pages.
USPTO Non-Final Rejection for U.S. Appl. No. 12/166,228 dated Dec. 30, 2009; 11 pages.
USPTO Non-Final Rejection for U.S. Appl. No. 12/239,692 dated Nov. 29, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/380,141 dated Jan. 29, 2013; 6 pages.
USPTO Non-Final Rejection for U.S. Appl. No. 12/380,141 dated Sep. 5, 2012; 6 pages.
USPTO Non-Final Rejection for U.S. Appl. No. 12/380,141 dated Sep. 19, 2011; 6 pages.
USPTO Non-Final Rejection for U.S. Appl. No. 12/395,462 dated Aug. 23, 2011; 5 pages.
USPTO Non-Final Rejection for U.S. Appl. No. 12/395,969 dated Feb. 8, 2013; 24 pages.
USPTO Non-Final Rejection for U.S. Appl. No. 12/395,969 dated Dec. 16, 2011; 17 pages.
USPTO Non-Final Rejection for U.S. Appl. No. 12/606,147 dated Aug. 23, 2011; 6 pages.
USPTO Non-Final Rejection for U.S. Appl. No. 12/861,812 dated Apr. 15, 2011; 26 pages.
USPTO Non-Final Rejection for U.S. Appl. No. 13/049,556 dated Jan. 25, 2013; 11 pages.
USPTO Non-Final Rejection for U.S. Appl. No. 13/612,803 dated Feb. 5, 2013; 7 pages.
USPTO Non-Final Rejection for U.S. Appl. No. 13/720,861 dated Mar. 11, 2013; 9 pages.
USPTO Non-Final Rejection U.S. Appl. No. 11/512,042, dated Jul. 13, 2010, 14 pages.
USPTO Non-Final Rejection U.S. Appl. No. 11/601;465 dated Oct. 2, 2008, 16 pages.
USPTO Non-Final Rejection, U.S. Appl. No. 11/601,465, dated Dec. 28, 2007, 16 pages.
USPTO Non-Final Rejection, U.S. Appl. No. 11/824,249 dated Mar. 30, 2012, 10 pages.
USPTO Non-Final Rejection, U.S. Appl. No. 12/332,980, dated Dec. 22, 2010, 9 pages.
USPTO Notice of Allowance for U.S. Appl. No. 09/975,105 dated Dec. 4, 2006; 4 pages.
USPTO Notice of Allowance for U.S. Appl. No. 09/986,338 dated Feb. 16, 2010; 4 pages.
USPTO Notice of Allowance for U.S. Appl. No. 10/888,666 dated Aug. 2, 2006; 11 pages.
USPTO Notice of Allowance for U.S. Appl. No. 11/230,719 dated Jan. 18, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 6, 2008; 7 pages.
USPTO Notice of Allowance for U.S. Appl. No. 11/398,179 dated Feb. 2, 2012; 5 pages.
USPTO Notice of Allowance for U.S. Appl. No. 11/484,085 dated Jun. 10, 2010; 4 pages.
USPTO Notice of Allowance for U.S. Appl. No. 11/489,944 dated Apr. 9, 2007; 7 pages.
USPTO Notice of Allowance for U.S. Appl. No. 11/489,944 dated May 24, 2007; 2 pages.
USPTO Notice of Allowance for U.S. Appl. No. 11/600,255 dated Feb. 5, 2013; 7 pages.
USPTO Notice of Allowance for U.S. Appl. No. 11/600,255 dated Mar. 11, 2013; 7 pages.
USPTO Notice of ANowance for U.S. Appl. No. 11/600,255 dated Apr. 20, 2011; 7 pages.
USPTO Notice of Allowance for U.S. Appl. No. 11/600,255 dated Jun. 30, 2012; 7 pages.
USPTO Notice of Allowance for U.S. Appl. No. 11/600,255 dated Jun. 16, 2011; 7 pages.
USPTO Notice of Allowance for U.S. Appl. No. 11/600,255 dated Jul. 27, 2010; 6 pages.
USPTO Notice of Allowance for U.S. Appl. No. 11/600,255 dated Dec. 9, 2010; 6 pages.
USPTO Notice of Allowance for U.S. Appl. No. 11/700,314 dated Sep. 16, 2010; 8 pages.
USPTO Notice of Allowance for U.S. Appl. No. 11/709,866 dated Feb. 16, 2010; 7 pages.
USPTO Notice of Allowance for U.S. Appl. No. 11/729,818 dated Feb. 24, 2010; 6 pages.
USPTO Notice of Allowance for U.S. Appl. No. 11/729,818 dated Nov. 13, 2009; 7 pages.
USPTO Notice of Allowance for U.S. Appl. No. 11/801,115 dated Feb. 2, 2012; 10 pages.
USPTO Notice of Allowance for U.S. Appl. No. 11/801,115 dated Nov. 30, 2011; 5 pages.
USPTO Notice of Allowance for U.S. Appl. No. 11/823,982 dated Feb. 1, 2010; 8 pages.
USPTO Notice of Allowance for U.S. Appl. No. 11/823,982 dated Oct. 6, 2009; 12 pages.
USPTO Notice of Allowance for U.S. Appl. No. 11/880,963 dated Oct. 2, 2009; 4 pages.
USPTO Notice of Allowance for U.S. Appl. No. 11/983,291 dated Mar. 9, 2010; 7 pages.
USPTO Notice of Allowance for U.S. Appl. No. 11/983,291 dated Jun. 21, 2010; 7 pages.
USPTO Notice of Allowance for U.S. Appl. No. 11/983,291 dated Sep. 29, 2010; 7 pages.
USPTO Notice Allowance for U.S. Appl. No. 11/983,291 dated Oct. 22, 2009; 7 pages.
USPTO Notice Allowance for U.S. Appl. No. 12/040,387 dated Mar. 29, 2012; 8 pages.
USPTO Notice Allowance for U.S. Appl. No. 12/040,387 dated Nov. 8, 2012; 9 pages.
USPTO Notice Allowance for U.S. Appl. No. 12/166,228 dated Mar. 22, 2011; 8 pages.
USPTO Notice Allowance for U.S. Appl. No. 12/167,100 dated Jan. 12, 2011; 8 pages.
USPTO Notice Allowance for U.S. Appl. No. 12/167,100 dated Apr. 29, 2011; 8 pages.
USPTO Notice Allowance for U.S. Appl. No. 12/167,100 dated Jun. 28, 2011; 8 pages.
USPTO Notice Allowance for U.S. Appl. No. 12/167,100 dated Sep. 1, 2011; 8 pages.
USPTO Notice Allowance for U.S. Appl. No. 12/167,100 dated Sep. 30, 2010; 7 pages.
USPTO Notice Allowance for U.S. Appl. No. 12/239,692 dated Jan. 5, 2012; 8 pages.
USPTO Notice Allowance for U.S. Appl. No. 12/239,692 dated May 16, 2012; 8 pages.
USPTO Notice Allowance for U.S. Appl. No. 12/239,692 dated Jun. 25, 2012; 8 pages.
USPTO Notice Allowance for U.S. Appl. No. 12/239,692 dated Aug. 15, 2012; 8 pages.
USPTO Notice Allowance for U.S. Appl. No. 12/239,692 dated Sep. 18, 2012; 8 pages.
USPTO Notice Allowance for U.S. Appl. No. 12/239,692 dated Oct. 13, 2011; 8 pages.
USPTO Notice Allowance for U.S. Appl. No. 12/332,980 dated Oct. 4, 2011; 5 pages.

(56) References Cited

OTHER PUBLICATIONS

USPTO Notice Allowance for U.S. Appl. No. 12/367,279 dated Aug. 23, 2010; 7 pages.
USPTO Notice Allowance for U.S. Appl. No. 12/380,141 dated Jan. 26, 2012; 7 pages.
USPTO Notice Allowance for U.S. Appl. No. 12/380,141 dated Mar. 8, 2013; 5 pages.
USPTO Notice Allowance for U.S. Appl. No. 12/380,141 dated Apr. 10, 2012; 7 pages.
USPTO Notice Allowance for U.S. Appl. No. 12/380,141 dated May 15, 2012; 7 pages.
USPTO Notice Allowance for U.S. Appl. No. 12/380,141 dated Jun. 14, 2012; 8 pages.
USPTO Notice Allowance for U.S. Appl. No. 12/380,141 dated Jul. 31, 2012; 5 pages.
USPTO Notice Allowance for U.S. Appl. No. 12/380,141 dated Nov. 8, 2012; 7 pages.
USPTO Notice Allowance for U.S. Appl. No. 12/395,462 dated May 4, 2012; 8 pages.
USPTO Notice Allowance for U.S. Appl. No. 12/395,462 dated Jul. 20, 2012; 6 pages.
USPTO Notice Allowance for U.S. Appl. No. 12/395,462 dated Aug. 29, 2012; 5 pages.
USPTO Notice Allowance for U.S. Appl. No. 12/395,462 dated Oct. 2, 2012; 5 pages.
USPTO Notice Allowance for U.S. Appl. No. 12/395,462 dated Nov. 14, 2012; 5 pages.
USPTO Notice Allowance for U.S. Appl. No. 12/606,147 dated Mar. 16, 2012; 7 pages.
USPTO Notice Allowance for U.S. Appl. No. 12/606,147 dated Jul. 13, 2012; 7 pages.
USPTO Notice Allowance for U.S. Appl. No. 12/606,147 dated Aug. 13, 2012; 7 pages.
USPTO Notice Allowance for U.S. Appl. No. 12/606,147 dated Sep. 28, 2012; 6 pages.
USPTO Notice Allowance for U.S. Appl. No. 13/047,035 dated Dec. 14, 2012; 12 page.
USPTO Notice Allowance for U.S. Appl. No. 13/047,620 dated Jun. 27, 2012; 2 pages.
USPTO Notice Allowance for U.S. Appl. No. 13/301,674 dated Jun. 28, 2012; 8 pages.
USPTO Notice Allowance for U.S. Appl. No. 13/301,764 dated Oct. 4, 2012; 10 pages.
USPTO Notice Allowance for U.S. Appl. No. 13/612,803 date Dec. 10, 2012; 8 pages.
USPTO Notice Allowance for U.S. Appl. No. 11/600,255, dated Apr. 12, 2012, 7 pages.
USPTO Notice Allowance for U.S. Appl. No. 11/601,465, dated Jan. 11, 2010, 18 pages.
USPTO Notice Allowance for U.S. Appl. No. 11/601,465, dated Mar. 11, 2011, 17 pages.
USPTO Notice Allowance for U.S. Appl. No. 11/601,465, dated Apr. 22, 2010, 41 pages.
USPTO Notice Allowance for U.S. Appl. No. 11/601,465, dated May 8, 2009, 14 pages.
USPTO Notice Allowance for U.S. Appl. No. 11/601,465, dated Jun. 28, 2011, 21 pages.
USPTO Notice Allowance for U.S. Appl. No. 11/601,465, dated Aug. 10, 2010, 17 pages.
USPTO Notice Allowance for U.S. Appl. No. 11/601,465, dated Sep. 10, 2009, 21 pages.
USPTO Notice Allowance for U.S. Appl. No. 11/601,465, dated Oct. 7, 2011, 19 pages.
USPTO Notice Allowance for U.S. Appl. No. 11/601,465, dated Nov. 26, 2010, 16 pages.
USPTO Notice Allowance for U.S. Appl. No. 11/729,818, dated Jan. 26, 2011, 12 pages.
USPTO Notice Allowance for U.S. Appl. No. 11/729,818, dated May 9, 2011, 8 pages.
USPTO Final Rejection for U.S. Appl. 13/720,861 dated May 14, 2013, 7 pages.

\* cited by examiner

METHODS AND CIRCUITS FOR MEASURING MUTUAL AND SELF CAPACITANCE

CROSS REFERENCE TO RELATED APPLICATION

This application is a continuation of U.S. patent application Ser. No. 12/606,147 filed Oct. 26, 2009, now U.S. Pat. No. 8,319,505, which claims the benefit of U.S. Provisional Patent Application No. 61/108,450 filed Oct. 24, 2008 and which is a continuation-in-part of U.S. patent application Ser. No. 12/395,462 filed Feb. 27, 2009, now U.S. Pat. No. 8,358,142, which claims the benefit of U.S. Provisional Patent Application No. 61/067,539 filed Feb. 27, 2008, all of which are hereby incorporated by reference.

TECHNICAL FIELD

The present disclosure relates generally to touch sensors and, more particularly, to capacitive touch sensors.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products.

BRIEF DESCRIPTION OF THE DRAWINGS

Embodiments are illustrated by way of example and are not intended to be limited by the figures of the accompanying drawings, in which like references indicate similar elements and in which.

DETAILED DESCRIPTION

Figure 1:
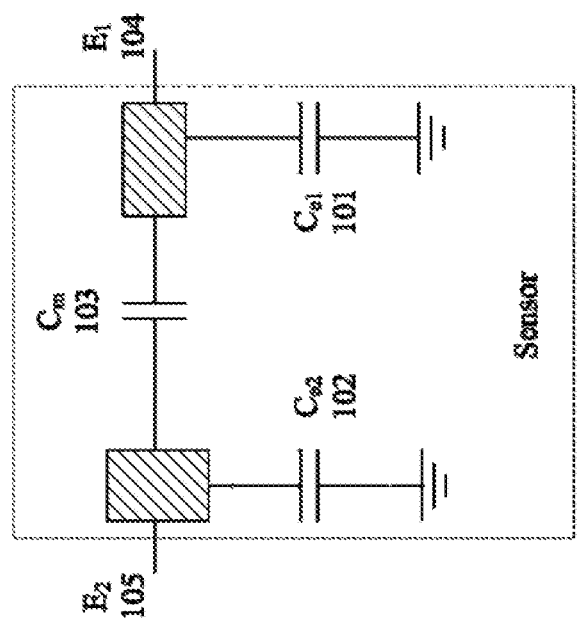
FIG. 1 illustrates two electrodes situated close to each other, according to one embodiment.

In the following description, for purposes of explanation, numerous specific details are set forth in order to provide a thorough understanding of embodiments of the present invention. It will be evident, however, to one skilled in the art that embodiments of the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Like reference numerals denote like references elements throughout.

A capacitive sensor may be characterized by a base capacitance that includes a self capacitance component and a mutual capacitance component. Since the values of these capacitance components affect the operation of the capacitive touch sensor and may vary from one capacitive sensor to another, a capacitive sensing circuit may benefit from the capability of independently measuring the self and mutual capacitances of a capacitive sensor.

Apparatus for and methods of measuring mutual and self capacitance in a capacitive touch sensor are described. The apparatus and methods described herein may be used in capacitive touch detection systems such as, for example, capacitive touch screens and, in particular, with capacitive touch screens having multiple simultaneous touch detection capabilities. Alternatively, the apparatus and methods described herein may be used with single touch detection systems or other types of capacitive touch systems.

The capacitance measurement circuits described herein may be used for touch detection in single electrode systems, transmit/receive (TX-RX) systems, or in combined TX-RX and single electrode systems. The TX-RX systems can use the mutual capacitance change detection, and single electrode systems can use the self capacitance change detection. In some embodiments, additional multiplexers can be added for multiple electrode scanning. In other embodiments additional capacitance-to-current converters may be added to allow parallel scanning of multiple sensor electrodes. The capacitance measurement circuits described herein may be used in various applications including, for example, single button applications, multiple buttons applications, linear and radial sliders, dual dimension touchpads and touchscreens, and multi-touch touchpad and touchscreen applications. Multi-touch touchpad and touchscreen systems are composed of a matrix of RX and TX electrodes, where the presence (e.g., touch) of a finger (or other conductive object) is detected as a decrease in the mutual capacitance at the intersection of the TX-RX electrodes.

Embodiments of the present invention allow for measurement of two or more 'electrodes' mutual and self capacitance separately. Capacitance measurement can be performed with a single pair of electrodes or with the use of a multiple electrode system. Two electrodes situated close to each other are shown at FIG. 1, where $C_{e1}$ 101 and $C_{e2}$ 102 are electrode self capacitances, and $C_m$ 103 is the mutual capacitance between the two electrodes $E_1$ 104 and $E_2$ 105.

Figure 2:
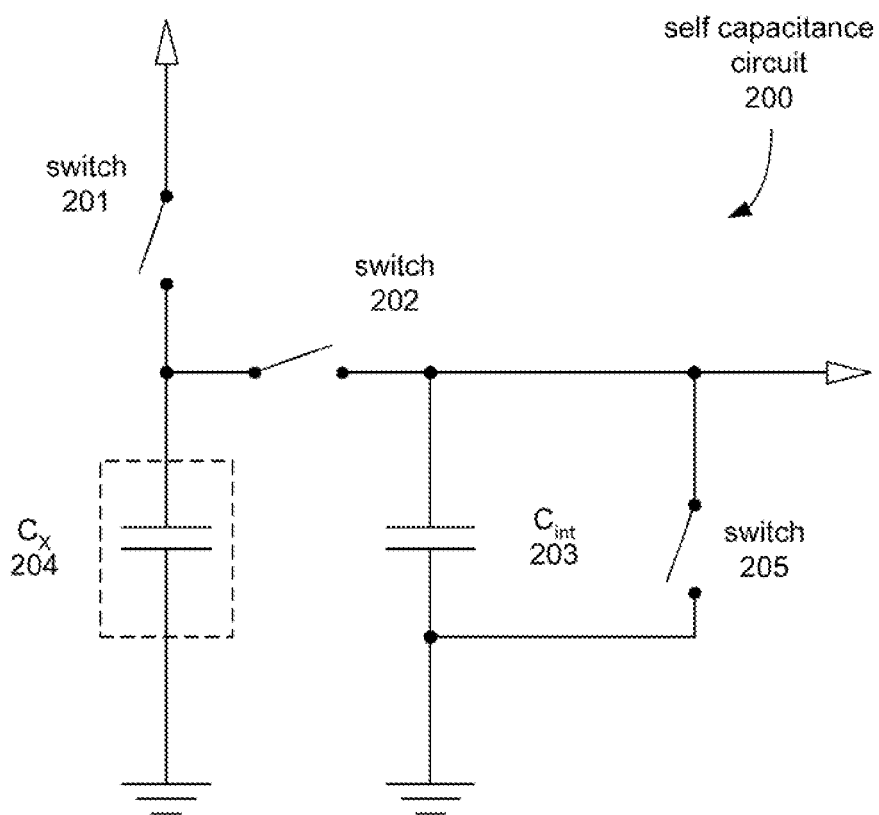
FIG. 2 illustrates one embodiment of a self-capacitance circuit that uses a charge accumulation technique.

There are various circuit implementations that may be used for performing capacitance measurement. FIG. 2 illustrates a self-capacitance circuit 200 that uses a charge accumulation technique to measure the capacitance $C_X$ 204. A charge accumulation technique operates in the following way: initially the integration capacitor 203 is reset by turning on a reset signal for some time which sets switch 205 such that both ends of integration capacitor 203 are grounded. After reset, the switches 201 and 202 start operation in the two non-overlapping phases, wherein switch 201 when closed accumulates charge onto $C_x$ and wherein switch 202 when closed allows that charged to be integrated onto $C_{int}$ 203. As more charge is integrated onto integration capacitor $C_{int}$ 203, the voltage on $C_{int}$ 203 starts increasing. The sensing capacitance may be determined by the number of switching cycles used to get the integrator capacitor voltage to some threshold value, such as $V_{DD}/2$ or a bandgap voltage ($V_{BG}$).

With such a charge accumulation technique, the voltage on the integration capacitance rises exponentially with respect to time (said time can be measured by a count of the number of cycle it takes to reach the threshold value). This relationship can be linearized for measurement methods where capacitance is calculated as a function of integration capacitor voltage after a predefined number of cycles. Also, the mutual capacitance measurement scheme has some sensitivity to the sensor self capacitance, which decreases the measurement accuracy.

Figure 3:
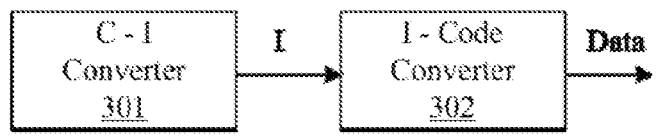
FIG. 3 illustrates a block diagram of an apparatus for measuring mutual or self capacitance, according to one embodiment.

FIG. 3 illustrates a block diagram of a capacitance measurement circuit 300 for measuring mutual or self capacitance, according to one embodiment of the present invention. The apparatus illustrated in FIG. 3 can be used for separately measuring mutual or self capacitances of a capacitance sensor. In order to measure a mutual capacitance, the $C_{e1}$, $C_{e2}$ (of FIG. 1) capacitance influence should be excluded. This can be accomplished by charging and discharging the $C_{e2}$ electrode from a low-impedance voltage source and keeping the voltage of the $C_{e1}$ electrode close to constant to minimize the influence of its charge-discharge current. In order to measure the self-capacitance (of $C_{e1}$ or $C_{e2}$) the voltage change across $C_m$ should be kept to zero to minimize the influence of this capacitance on the measurement results.

The capacitance measurement circuit 300 can be separated into two parts: the switching capacitor front-end capacitance-to-current converter 301, and the back-end current-to-digital value converter 302, as illustrated in FIG. 3. In the following description, the front-end and back-end circuits are described separately. A switching capacitor front-end converts the sensing capacitance to current pulses. The back-end system averages the current and converts it into readable digital values. The circuits described herein are based on a switching capacitor technique in capacitance-to-current converter circuits.

FIGS. 4A, 4B, 5A and 5B show different embodiments for a capacitance to current converter for mutual capacitance measurement. In the referenced figures, a voltage buffer 401 resides between the integration capacitor $C_{int}$ 406 and the switches 402, 404 connecting to the mutual electrodes of the capacitance-to-current. It should be noted that the integration capacitor $C_{int}$ 406 is considered as part of the current measurement system and shown here for ease of explanation. The integration capacitor 406 can be connected between the converter output and a fixed potential net, for example, GND and $V_{CC}$, as illustrated in FIGS. 4A, 4B, 5A and 5B, respectively.

The operation of the circuit may be described in several stages, which are repeated in cycle. Table 1 contains the switching sequence of switches for the circuits shown in FIGS. 4A and 4B.

TABLE 1

Figure 4A:
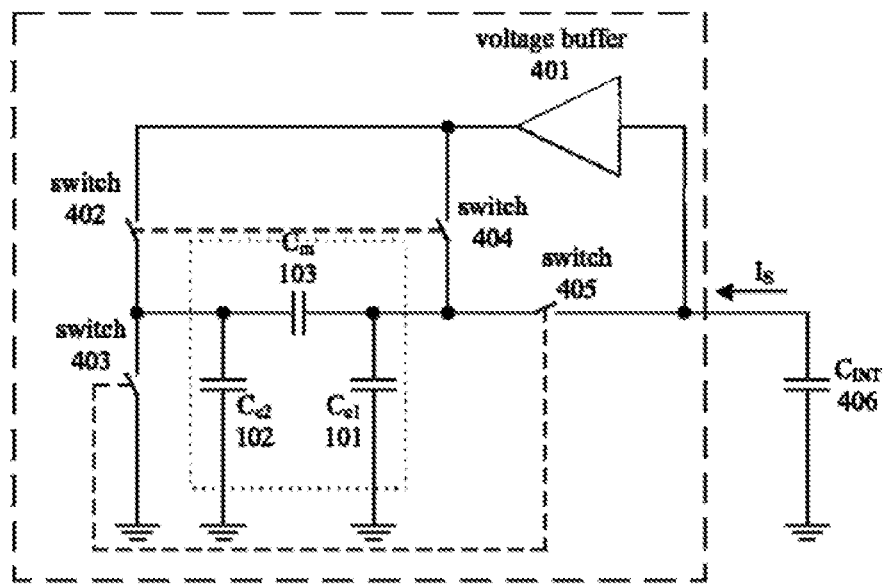
FIG. 4A illustrates one embodiment of a capacitance to current sink converter having an integration capacitor coupled to ground.
Figure 4B:
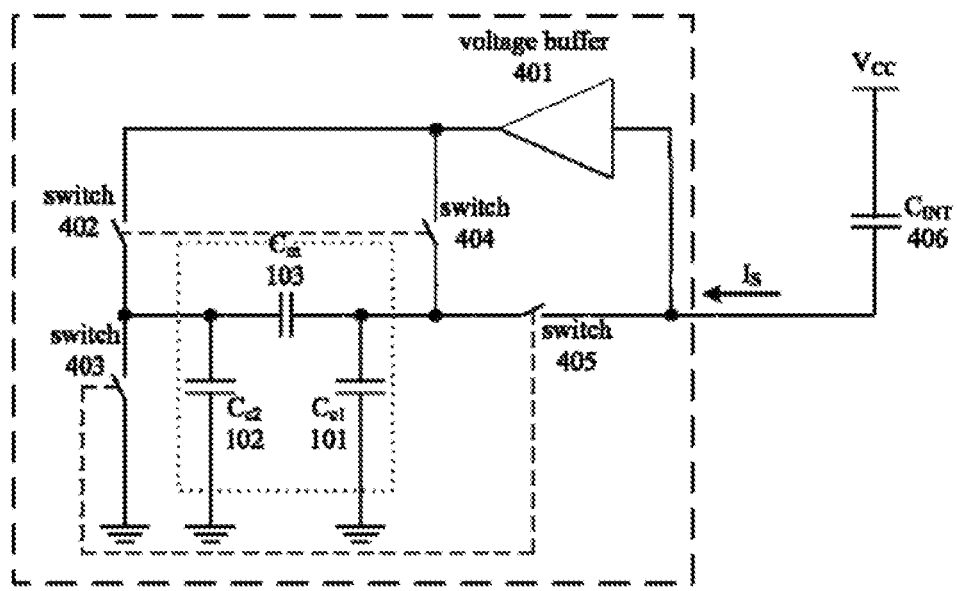
FIG. 4B illustrates one embodiment of a capacitance to current sink converter having an integration capacitor coupled to a high voltage supply potential.

Switching sequence of switches shown in FIGS. 4A and 4B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $U_{Cm} = 0$, $U_{Ce1} = U_{Ce2} = U_{Cint} = U_{buf}$ |
| 3 | OFF | OFF | OFF | OFF | $U_{Cm} = 0$, $U_{Ce1} = U_{Ce2} = U_{Cint}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 5A:
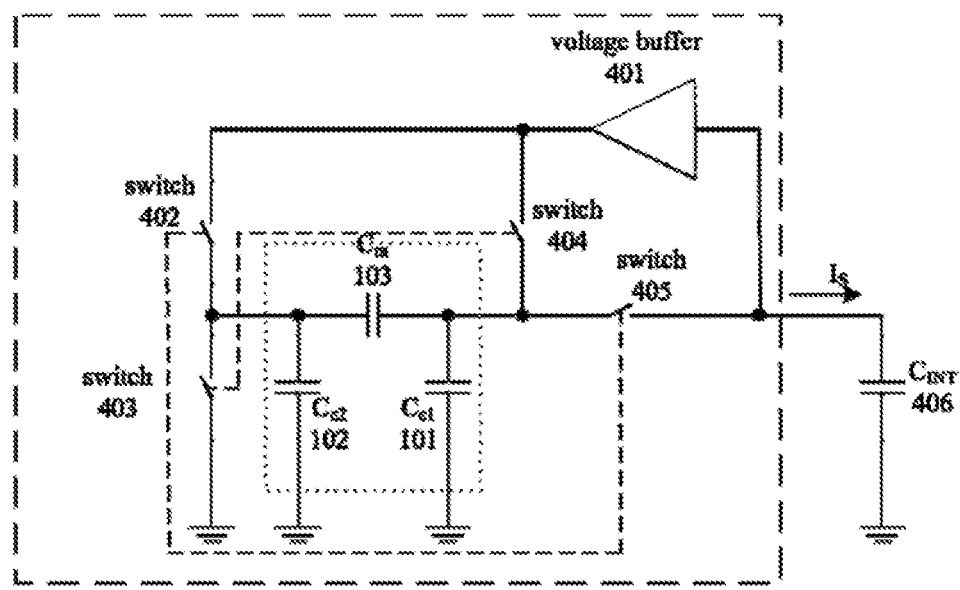
FIG. 5A illustrates one embodiment of a capacitance to current source converter having an integration capacitor coupled to ground.
Figure 5B:
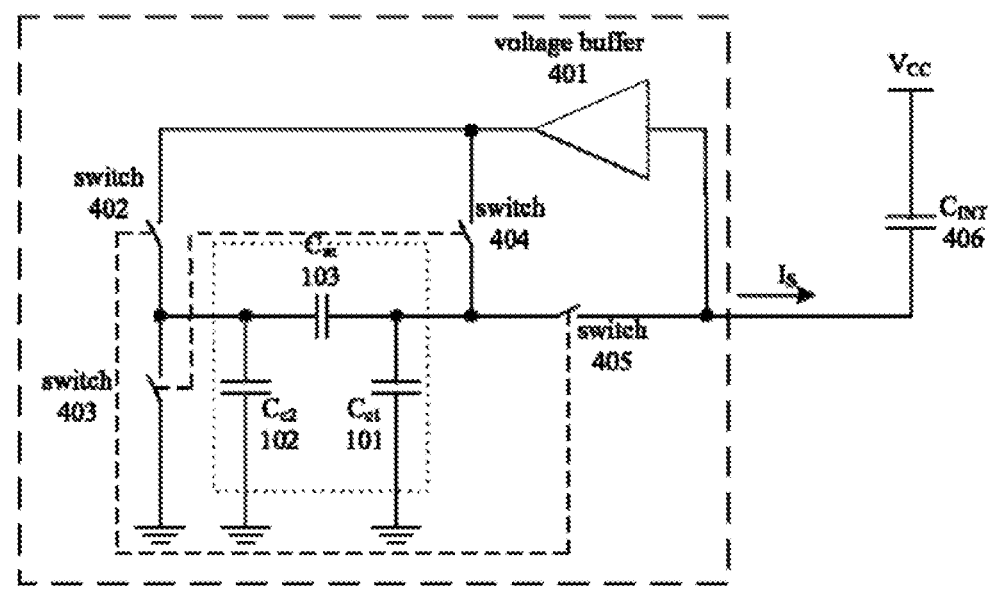
FIG. 5B illustrates one embodiment of a capacitance to current source converter having an integration capacitor coupled to a high voltage supply potential.

Table 2 contains the switching sequence of switches for the circuits shown in FIGS. 5A and 5B.

TABLE 2

Switching sequence of switches shown in FIGS. 5A and 5B.

| Stage | Switch 402 | Switch 403 | Switch 404 | Switch 405 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $U_{Cm} = 0, U_{Ce1} = U_{Cint}, U_{Ce2} = U_{Cint}$ |
| 5 | OFF | OFF | OFF | OFF | $U_{Cm} = 0, U_{Ce1} = U_{Cint}, U_{Ce2} = U_{Cint}$ |

The stages from 2 to 5 are performed in cycles. In effect, the circuits shown in FIGS. 4A and 4B may act as current sinks, and the circuits shown in FIGS. 5A and 5B may act as current sources in the respective embodiment. The integration capacitor $C_{int}$ 406 is external to the capacitance-to-current converter and is not part of the current measurement circuit.

Figure 6A:
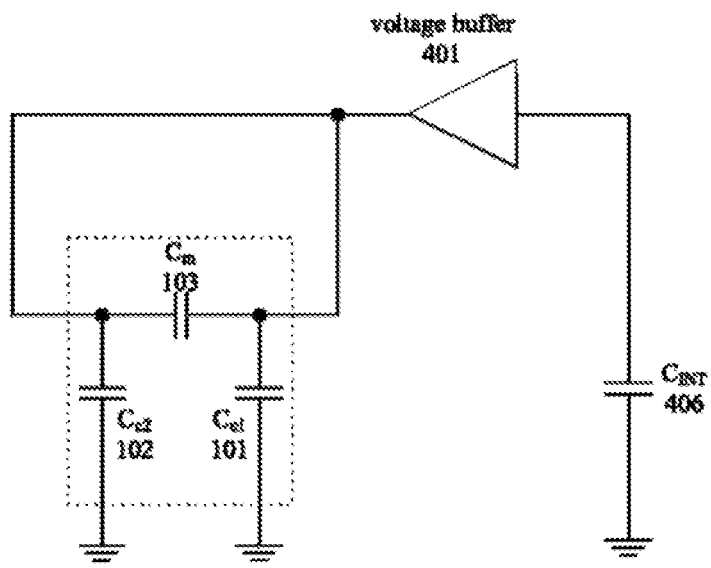
FIG. 6A illustrates a first phase of a converter operation, according to one embodiment.
Figure 6B:
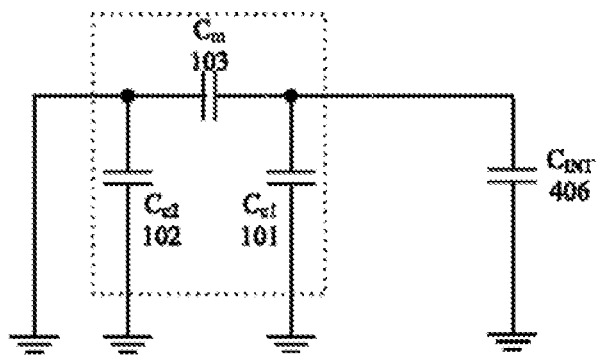
FIG. 6B illustrates a second phase of a converter operation, according to one embodiment.

FIGS. 6A and 6B illustrates one embodiment of the operation phases for the circuits shown in FIGS. 4A and 4B, respectively. During the first phase (FIG. 6A), both ends of the $C_m$ 103 are connected to voltage buffer 401. During the second phase (FIG. 6B), the left $C_m$ terminal is grounded and the right terminal is connected to the integration capacitor $C_{int}$ 406.

For both circuits, an averaged absolute current sink/source ($I_S$) value can be calculated by Equation 1:

$$I_S = f_{sw} \cdot U_{Cint} \cdot C_m \quad (1)$$

where, $f_{sw}$ is the switching frequency of phases 2-5 repeating. It should be noted that the capacitance of $C_{e2}$ electrode 102 is shunted by switch 402 or 403 in each operation phase and does not have an impact on the output current. The capacitance of the $C_{e1}$ electrode 101 has a potential equal to $U_{Cint}$ during both charge transfer stages and is not recharged between different operation phases. Therefore, the output current is determined by the value of $C_m$ 103 and the potential applied across it.

A special case of the capacitance-to-current converter operation is now considered, when it is loaded by stand-alone integration capacitor $C_{int}$ 406. In this case, the relationship between the voltage change on $U_{Cint}$ and the cycles count N has a nonlinear exponential character, as expressed in Equation 2:

$$U_{Cint}^N = U_{Cint}^0 \cdot \left(1 - \frac{C_m}{C_{int}}\right)^N \left(U_{Cint}^N \approx U_{Cint}^0 \cdot e^{-N\frac{C_m}{C_{int}}}\right) \quad (2)$$

where, N is the quantity of conversion cycles and $U_{Cint}^0$ is the voltage on the integration capacitor 406 at the initial time.

The exponential character of this dependence is caused by the positive voltage feedback via buffer 401: increasing voltage on the integration capacitor 406 (when the capacitance-to-current converter is configured as a current source) causes a larger charge quantum being moved in each phase and an increase in the speed of the integration capacitor 406 voltage rising. The current measurement circuit may not keep a voltage on the integration capacitor 406 constant in this embodiment.

The circuit embodiments illustrated in FIGS. 7A, 7B, 8A, and 8B may be used to keep voltage on $C_{int}$ 406 constant. The difference between the circuit embodiments illustrated in FIGS. 7A, 7B, 8A, and 8B, versus those illustrated in FIGS. 4A, 4B, 5A, and 5B, is that the left terminal of $C_m$ 103 is connected to the fixed voltage source $V_{DD}$ in FIGS. 7A, 7B, 8A and 8B. In FIGS. 7A, 7B, 8A and 8B the variable buffer output voltage of an analog buffer 701 is coupled to the right terminal of $C_m$ 103 and in FIGS. 4A, 4B, 5A and 5B buffer 401 is coupled with the left terminal of $C_m$ 103. Only the switch 702 connection is changed on the circuits illustrated in FIGS. 7A, 7B, 8A, and 8B.

Figure 7A:
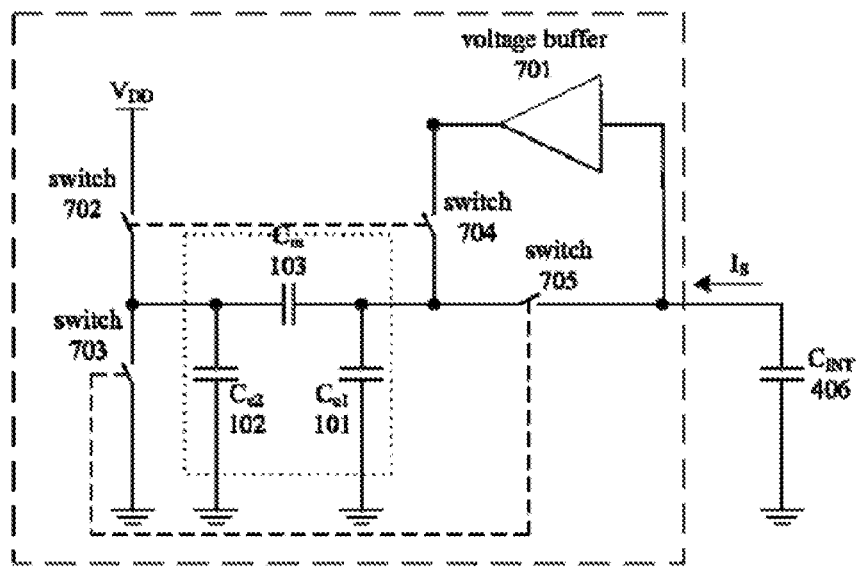
FIG. 7A illustrates one embodiment of a capacitance to current sink converter used for mutual capacitance measurement, having an integration capacitor coupled to ground.
Figure 7B:
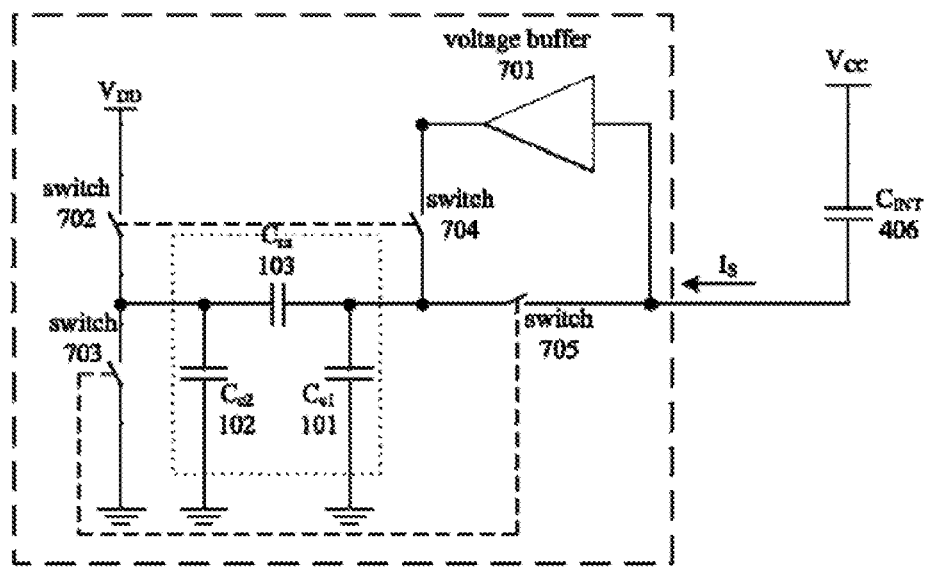
FIG. 7B illustrates one embodiment of a capacitance to current sink converter used for mutual capacitance measurement, having an integration capacitor coupled to $V_{DD}$.

The switching sequence of the switches illustrated in FIGS. 7A and 7B is shown in Table 3.

TABLE 3

Switching sequence of switches in FIGS. 7A and 7B.

| Stage | Switch 702 | Switch 703 | Switch 704 | Switch 705 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | ON | OFF | ON | OFF | $-U_{Cm} = U_{Vdd} - U_{Cint}, U_{Ce1} = U_{Cint} = U_{buf}, U_{Ce2} = U_{Vdd}$ |
| 3 | OFF | OFF | OFF | OFF | $U_{Cm} = U_{Vdd} - U_{Cint}, U_{Ce1} = U_{Cint}, U_{Ce2} = U_{Vdd}$ |
| 4 | OFF | ON | OFF | ON | $U_{Cm} = U_{Cint} = U_{Ce1}, U_{Ce2} = 0$ |
| 5 | OFF | OFF | OFF | OFF | $U_{Cm} = U_{Ce1}, U_{Ce2} = 0$ |

Figure 8A:
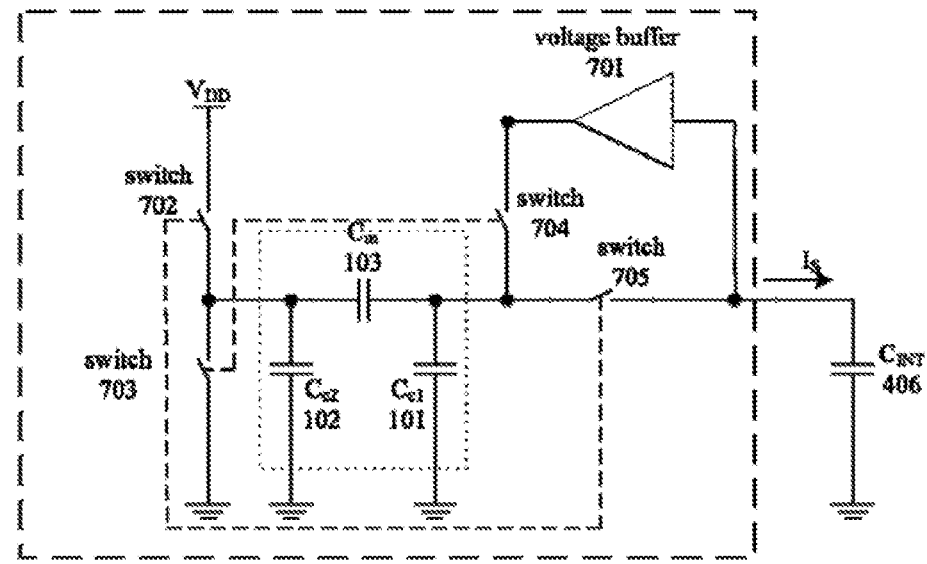
FIG. 8A illustrates one embodiment of a capacitance to current source converter having an integration capacitor coupled to ground.
Figure 8B:
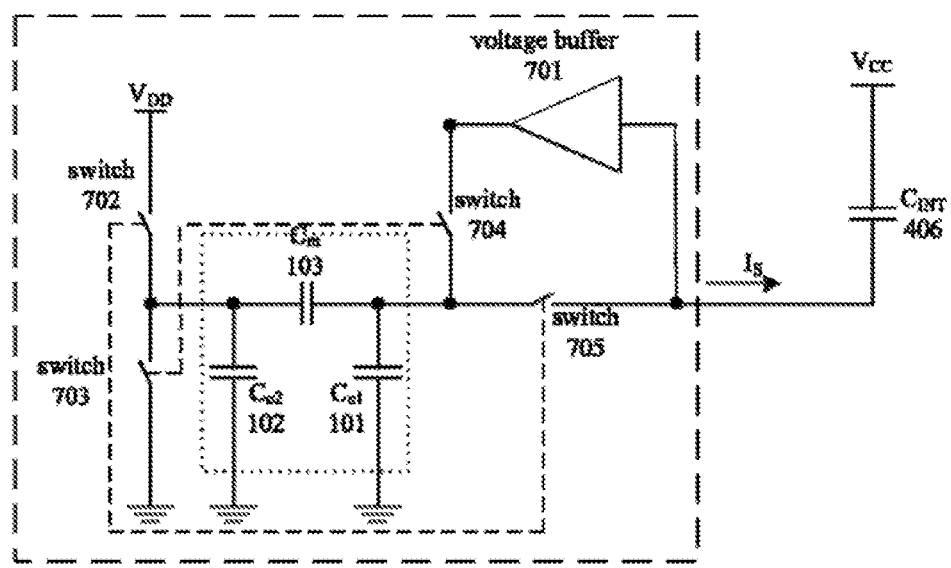
FIG. 8B illustrates one embodiment of a capacitance to current source converter having an integration capacitor coupled to a high voltage supply potential.

The switching sequence of the switches illustrated in FIGS. 8A and 8B is shown in Table 4.

TABLE 4

Switching sequence of switches in FIGS. 8a and 8b

| Stage | Switch 702 | Switch 703 | Switch 704 | Switch 705 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $-U_{Cm} = U_{Vdd} - U_{Cint}, U_{Ce1} = U_{Cint}, U_{Ce2} = U_{Vdd}$ |
| 5 | OFF | OFF | OFF | OFF | $U_{Cm} = 0, U_{Ce1} = U_{Cint}, U_{Ce2} = U_{Vdd}$ |

The stages from 2 to 5 are performed in cycles. As a result, the average current flowing out of the $C_{int}$ 406 capacitor for the circuits on FIGS. 7A, 7B, 8A, and 8B may be calculated by Equation 3:

$$I_S = f_{sw} \cdot U_{Vdd} \cdot C_m \quad (3)$$

For the given values of $f_{sw}$ and $V_{DD}$ parameters, the output current ($I_S$) linearly depends on and is proportional to $f_{sw}$ and $V_{DD}$ in this embodiment. The change of current direction is done by a change of the switches' operation phases. If the current measurement subsystem does not load the integration capacitor $C_{int}$ 406, a voltage on this capacitor changes linearly with the number of cycles N, as expressed in Equation 4:

$$U_{Cint}^N = U_{Vdd} \cdot \left(1 - N \cdot \frac{C_m}{C_{int}}\right) \quad (4)$$

A similar Equation 5 is used for describing the circuits illustrated in FIGS. 8A and 8B:

$$U_N = N \cdot U_{Vdd} \cdot \frac{C_m}{C_{int}} \quad (5)$$

The mutual capacitance circuit embodiments described previously may be used for self-capacitance measurement with minimal hardware changes by routing the buffer signal to the left-side switches. To do this, the switched voltages may be adjusted in such a way that the voltage change on the mutual capacitance $C_m$ is equal to zero between different phases. In other circuit configurations, the voltage on $C_{e2}$ is kept constant but the voltage on $C_m$ is varied. In the circuit embodiments illustrated in FIGS. 7A, 7B, 8A, and 8B, the voltage on $C_{e2}$ is varied and the voltage change on $C_m$ is kept constant.

Figure 9A:
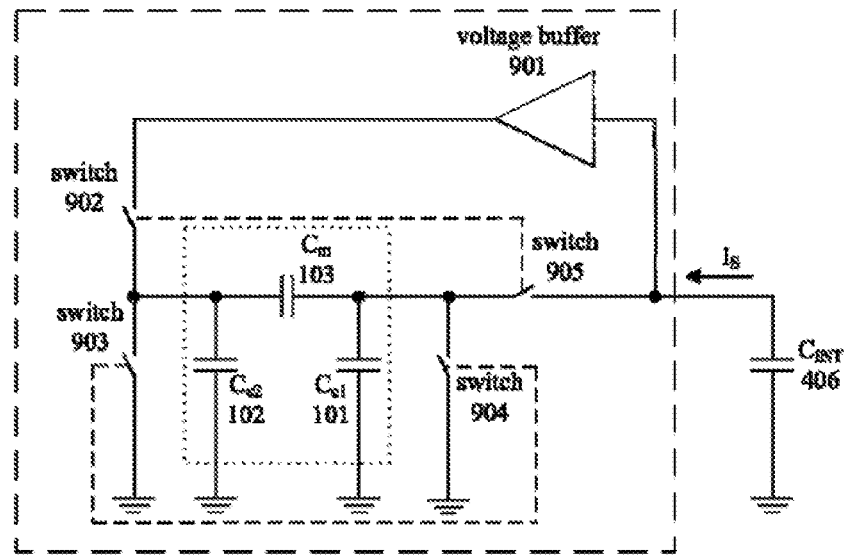
FIG. 9A illustrates one embodiment of a capacitance to current sink converter used for self capacitance measurement, having an integration capacitor coupled to ground.
Figure 9B:
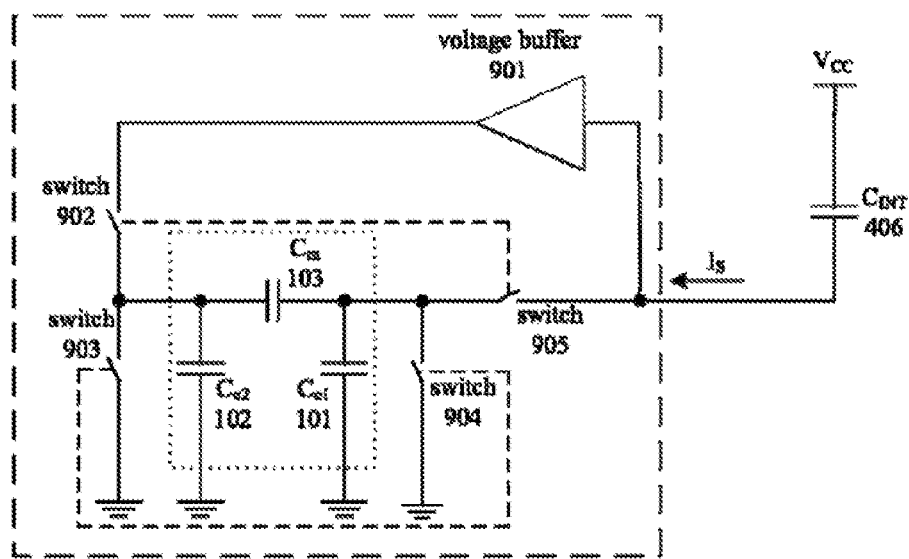
FIG. 9B illustrates one embodiment of a capacitance to current sink converter used for self capacitance measurement, having an integration capacitor coupled to a high voltage supply potential.

FIGS. 9A and 9B illustrate embodiments of a capacitance to current sink converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 9A and 9B respectively. Alternatively, the integration capacitor 406 can be connected between the converter output and other fixed potentials.

The switching sequence of switches illustrated in the circuit of FIGS. 9A and 9B is shown in Table 5.

TABLE 5

Switching sequence of switches illustrated in FIGS. 9A, 9B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Ce1} = U_{Ce2} = 0$, $U_{Cm} = 0$ |
| 3 | OFF | OFF | OFF | OFF | $U_{Ce1} = U_{Ce2} = 0$, $U_{Cm} = 0$ |
| 4 | ON | OFF | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Figure 10A:
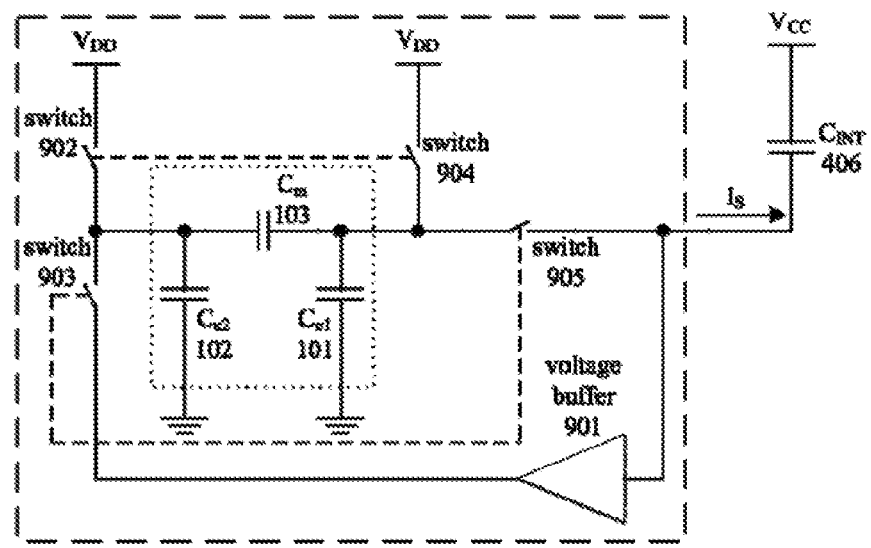
FIG. 10A illustrates one embodiment of a capacitance to current source converter used for self capacitance measurement, having an integration capacitor coupled to a high voltage supply potential.
Figure 10B:
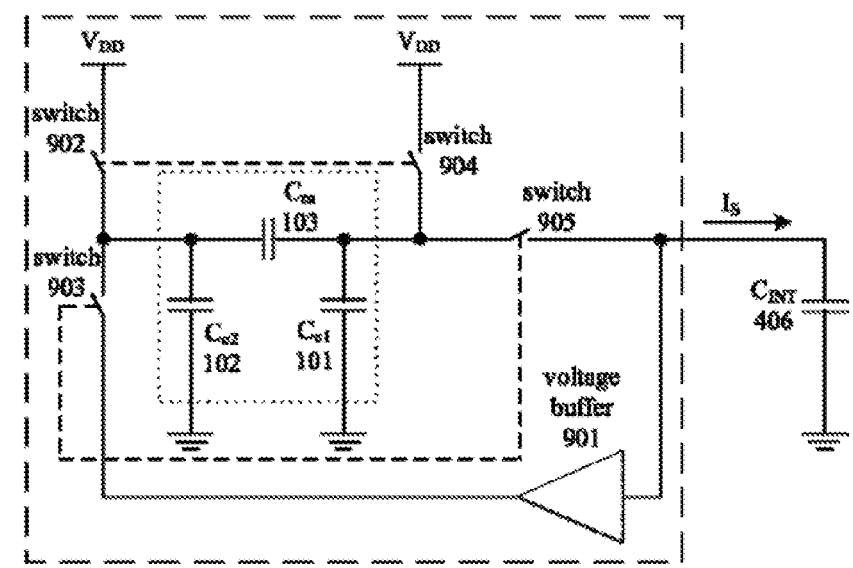
FIG. 10B illustrates one embodiment of a capacitance to current source converter used for self capacitance measurement, having an integration capacitor coupled to ground.

FIGS. 10A and 10B illustrate embodiments of a capacitance to current source converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 10A and 10B respectively. Alternatively, the integration capacitor 406 can be connected between the converter output and other fixed potentials.

The switching sequence of switches in FIGS. 10A and 10B is shown in Table 6.

TABLE 6

Switching sequence of switches illustrated in FIGS. 10A, 10B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | ON | OFF | ON | OFF | $U_{Ce1} = U_{Ce2} = U_{Vdd}$, $U_{Cm} = 0$ |
| 3 | OFF | OFF | OFF | OFF | $U_{Ce1} = U_{Ce2} = U_{Vdd}$, $U_{Cm} = 0$ |
| 4 | OFF | ON | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Stages 2 through 5 are performed in cycles. As a result, the average current flowing out of capacitor $C_{int}$ for the circuits illustrated in FIGS. 9A and 9B may be described by Equation 6:

$$I_S = f_{sw} \cdot U_{Cint} \cdot C_{e1} \quad (6)$$

The average current flowing into $C_{int}$ capacitor for the circuits illustrated in FIGS. 10A and 10B may be described by Equation 7:

$$I_S = f_{sw} \cdot (U_{Vdd} - U_{Cint}) \cdot C_{e1} \quad (7)$$

The potential difference on electrode capacitor $C_m$ 103 is equal to approximately zero during the stages of charge transfer and does not have an impact on the measurement in this embodiment. The $C_{e2}$ electrode 102 capacitance is switched off by switches 902 and 904 during the stages of operation. In this case, the relationship between the voltage change on $U_{Cint}$ and the cycle count N has a nonlinear exponential character for the circuits illustrated in FIGS. 9A and 9B, in accord with Equation 8:

$$U_{Cint}^N = U_{Cint}^0 \cdot \left(1 - \frac{C_{el}}{C_{int}}\right)^N \quad (8)$$

Equation 9 similarly describes the circuits illustrated in FIGS. 10A and 10B:

$$U_{Cint}^N = U_{Vdd} \cdot \left(1 - e^{-N\frac{C_{el}}{C_{int}}}\right) \quad (9)$$

Various alternative variants of the conversion circuits described above may be used. Alternative conversion circuits include integration circuits such as time measurement of the integration capacitor voltage threshold crossing, current integrations with an operational amplifier as a current integrator. Alternative conversion circuits include analog-to-digital circuits such as a current-to-voltage conversion using an operational amplifier and an ADC voltage measurement device or sigma-delta modulation circuits.

Figure 11:
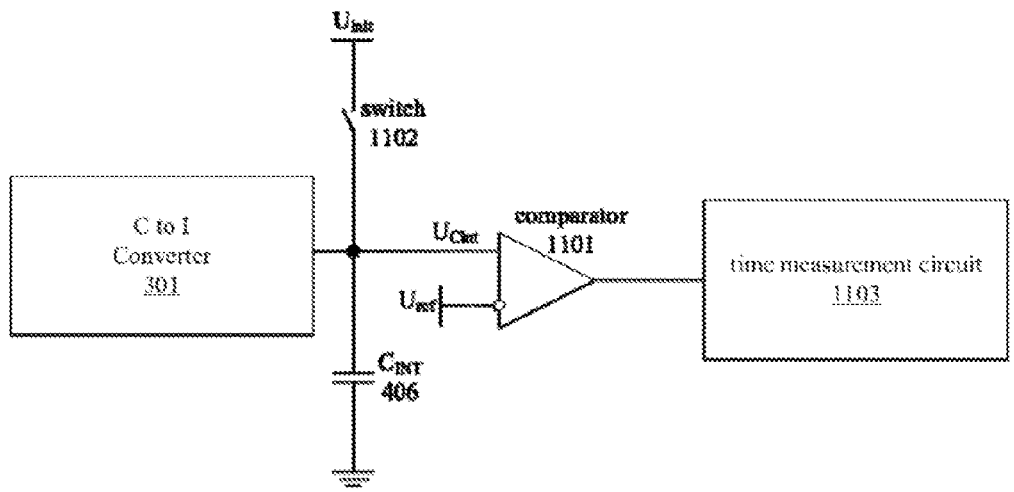
FIG. 11 illustrates one embodiment of an interval timer method for capacitance measurement.

FIG. 11 illustrates an interval timer method for capacitance measurement. In the circuit of FIG. 11, the integrator consists of a capacitor 406. The circuit of FIG. 11 operates in the following way. Initially, the voltage of integration capacitor 406 is set to $U_{init}$ by turning on, for some time period, a switch 1102. The comparator 1101 is used as threshold circuit and compares the voltage on the integration capacitor 406 with a reference voltage $U_{ref}$. The capacitance is measured by the time measurement circuit 1103 as the time elapsed (in the cycles count) until the comparator 1101 is triggered. The time is inversely proportional to the capacitance-to-current converter current in this embodiment. It should be noted that for switching capacitor current sink schemes, an integrator initial voltage ($U_{init}$) is set higher than the threshold voltage ($U_{ref}$).

For the current source schemes, the integrator initial voltage is lower than threshold voltage $U_{ref}$.

Figure 12:
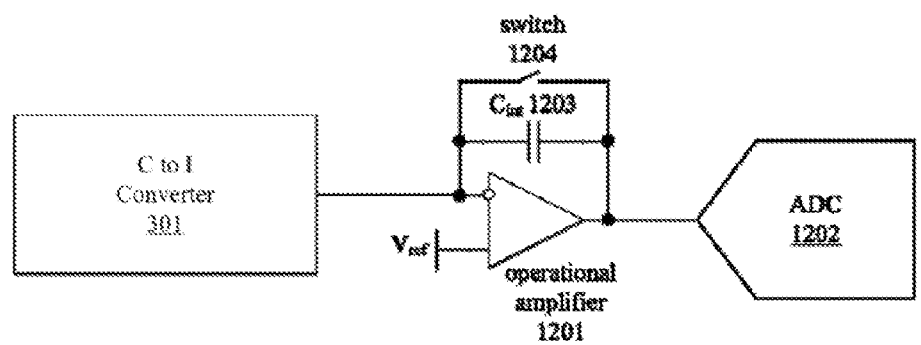
FIG. 12 illustrates one embodiment of a resettable current integrator with an operation amplifier and an analog-to-digital converter (ADC)
Figure 13:
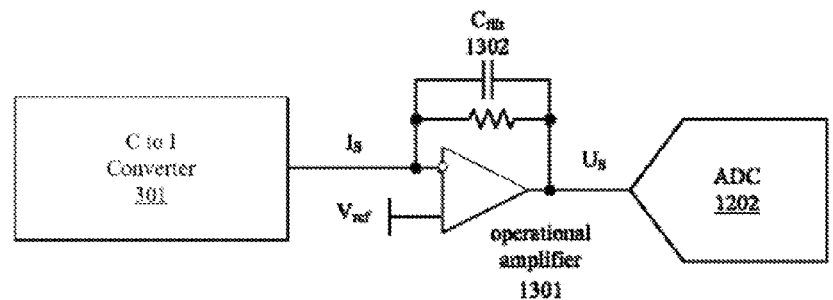
FIG. 13 illustrates one embodiment of a current-to-voltage converter built around an operational amplifier.

For more accurate current conversion, circuits based on current-to-voltage converters and current integrators may be used, as illustrated in FIGS. 12 and 13. FIG. 12 illustrates one embodiment of a resettable current integrator (where integration capacitor 1203 can be reset using switch 1204) with an operational amplifier 1201 with reference input voltage $V_{ref}$ and an analog-to-digital converter (ADC) 1202 coupled to the output of operational amplifier 1201. The ADC 1202 is used for integrator voltage measurement after the completion of a predefined number of integration cycles. Capacitance on the is converted to current by capacitance-to-current converter 301 and $C_{int}$ 1203 is charged with the output current to Vref on the operational amplifier 1201. The output of operational amplifier 1201 coupled to the opposite side of $C_{int}$ 1203 is then measured by ADC 1202 to calculate the value of the capacitance in the capacitance-to-current converter 301.

Figure 14:
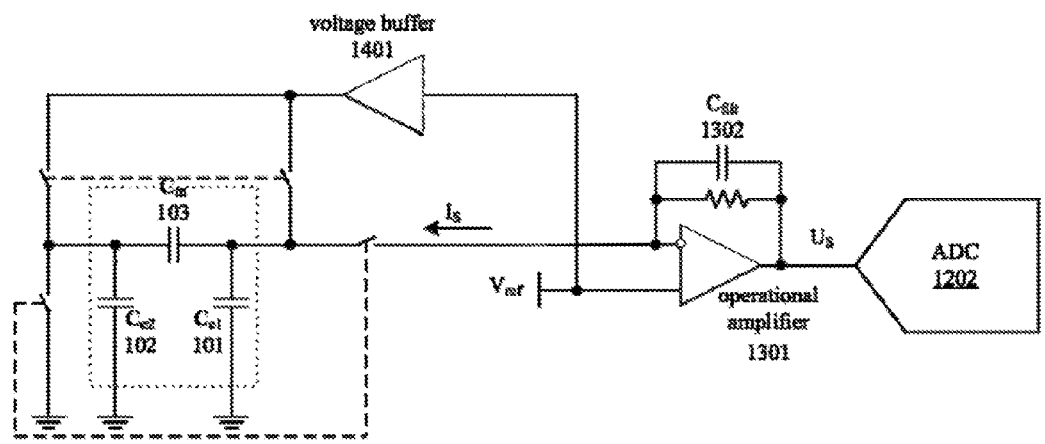
FIG. 14 illustrates one embodiment of a capacitance to current converter with a conversion circuit.

FIG. 13 illustrates one embodiment of a current-to-voltage converter built around an operational amplifier 1301. The converter of FIG. 13 also functions as a low pass filter (LPF) due to the presence of the filter capacitor $C_{filt}$ 1302 in the amplified feedback path. The output voltage $U_S$ is proportional to the input current $I_S$. The circuit of FIG. 13 operates continuously such that ADC conversion can be started any time after transient signals have stabilized. It should be noted that the buffer input inside the capacitance-to-code converter can be connected to the $V_{ref}$ net for the circuits illustrated in FIGS. 12 and 13, taking into account that both operational amplifier inputs have approximately the same potential. The schematic diagram of such a circuit configuration is illustrated in FIG. 14, where the input of voltage buffer 1401 is connected to the $V_{ref}$ net.

Figure 15:
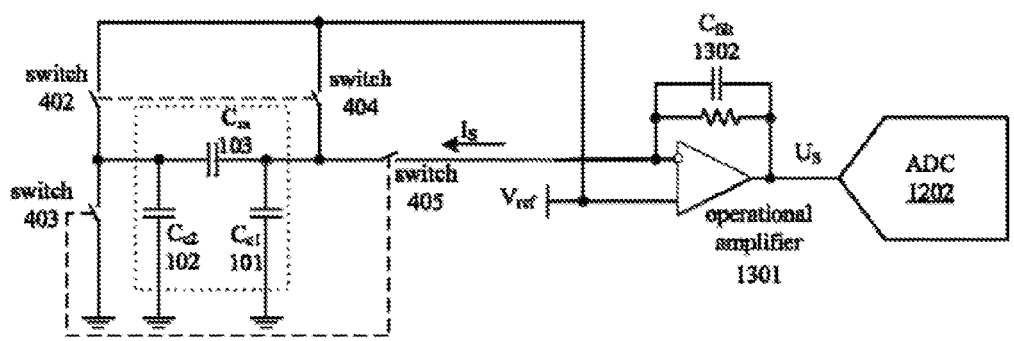
FIG. 15 illustrates one embodiment of a capacitance to current converter with a low-pass filter.

In an alternative embodiment, when the $V_{ref}$ voltage source has an acceptable low output resistance, then the voltage buffer 1401 may be eliminated from the circuits illustrated herein. As an example, the circuit from FIG. 4 composed of the measurement circuit of FIG. 13 is illustrated in FIG. 15. Accordingly, FIG. 15 is an example illustration of a capacitance-to-code converter with a low-pass filter that can be implemented without a voltage buffer 1401 coupled to the reference voltage source $V_{ref}$. In one embodiment, the reference voltage $V_{ref}$ used to supply the switches in the capacitance-to-current converter is selected to be as close to $V_{DD}$ as possible (limited by the working range of the operational amplifier 1301), to minimize the current flow out of $C_{e2}$ 102 relative to the current flowing through $C_m$ 103. In alternative embodiments, the switches in the converters can be supplied with other known voltages such as, for example, $V_{DD}$.

Figure 16:
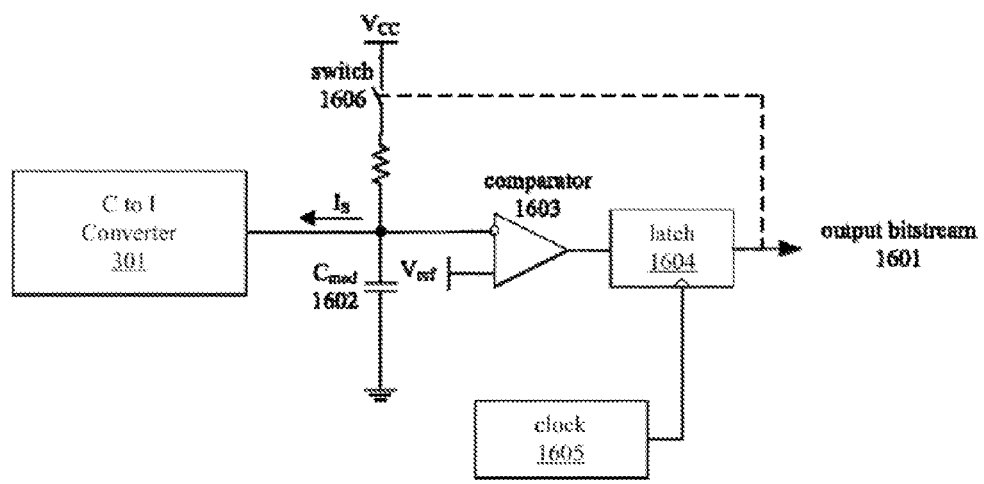
FIG. 16 illustrates one embodiment of a sigma-delta modulator configured as a capacitance to duty cycle converter.

The sigma-delta modulator circuits can be effectively used for the current-to-code conversion. An advantage of the sigma-delta modulator circuits is their integrative nature. FIG. 16 illustrates one possible example of a modulator implementation for a first order modulator. It should be noted that higher order modulator circuits can be used as well. The sigma-delta modulator of FIG. 16 converts the current $I_S$ to a code in output bitstream 1601. The current $I_S$ discharges modulation capacitor $C_{mod}$ 1602 until the voltage at $C_{mod}$ 1602 falls below $V_{ref}$ at which point comparator 1603 asserts its output to latch 1604, which outputs bits synchronously with a clock signal provided by clock 1605. The latch 1604 then closes switch 1606 to recharge $C_{mod}$ 1602 at a rate faster than it is being discharged by current $I_S$. When the voltage at $C_{mod}$ 1602 rises above $V_{ref}$, comparator 1603 de-asserts its output to latch 1604, which then opens synchronously to open switch 1606, allowing current $I_S$ to again discharge $C_{mod}$ 1602. This toggling of state of latch 1604 provides the bitstream 1601 which may then be evaluated to provide a digital-code equivalent of the measured capacitance.

Figure 17:
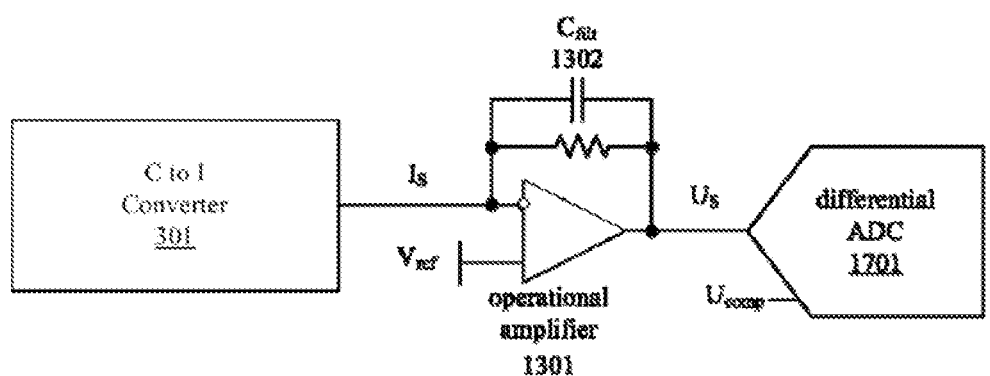
FIG. 17 illustrates one embodiment of a low pass filter with a differential analog to digital converter.

In one embodiment, the capacitance measurement circuit embodiments described previously may be used in touch sensitive devices. With such devices, a small capacitance change should be detected over the presence of large base capacitance. Such sensors have two components of capacitance, described in Equation 10:

$$C_S = C_{Sconst} + C_{Stouch} \quad (10)$$

where $C_{Sconst}$ is the capacitance of a sensor when touch is absent, and $C_{Stouch}$ is the change in capacitance caused by an input, such as a finger touch. The informative part of the sensor capacitance $C_S$ is the $C_{Stouch}$ component. In order to increase the resolution of the sensor, the particular compensation of the current generated by the $C_{Sconst}$ capacitance can be used. There are several possible implementations of this technique. In one embodiment, an ADC 1701 with differential inputs may be used as illustrated in FIG. 17. In the circuit of FIG. 17, the $U_{comp}$ voltage is supplied to the second input of ADC 1701.

Figure 18A:
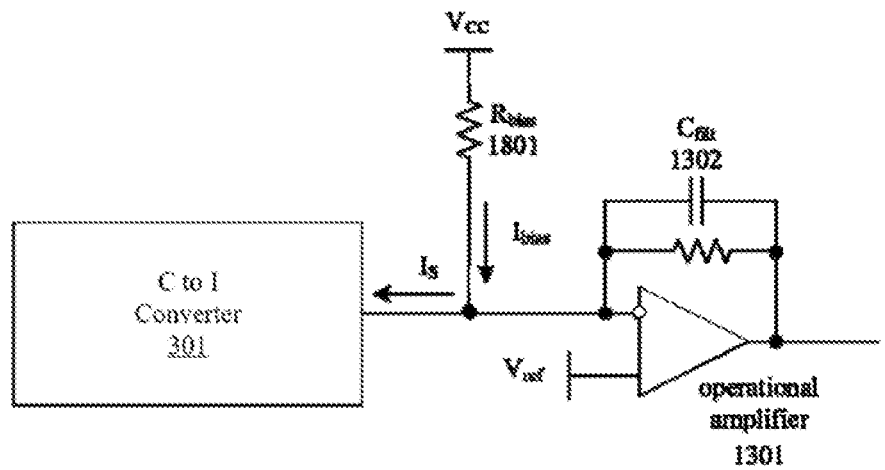
FIG. 18A illustrates base capacitance current compensation using a resistor as a current sink in a capacitance to current converter, according to one embodiment.
Figure 18B:
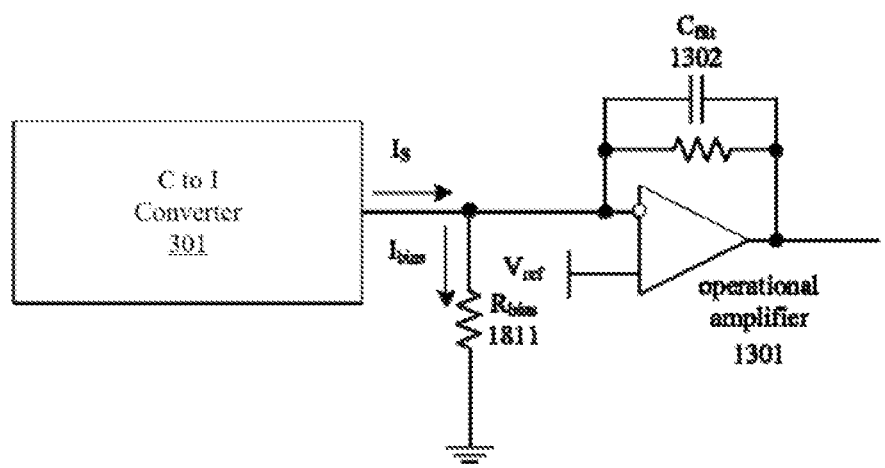
FIG. 18B illustrates base capacitance current compensation using a resistor for a current source in a capacitance to current converter, according to one embodiment.
Figure 19A:
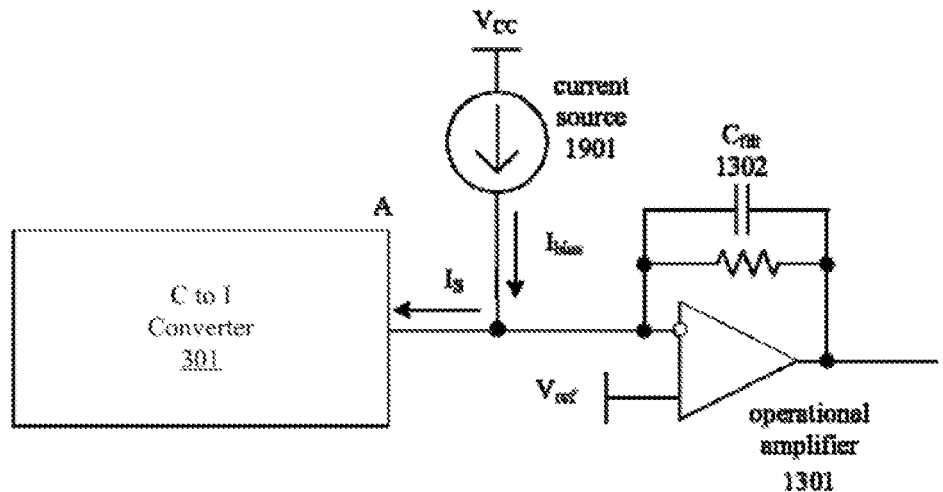
FIG. 19A illustrates base capacitance current compensation using a current source as a current sink in a capacitance to current converter, according to one embodiment.
Figure 19B:
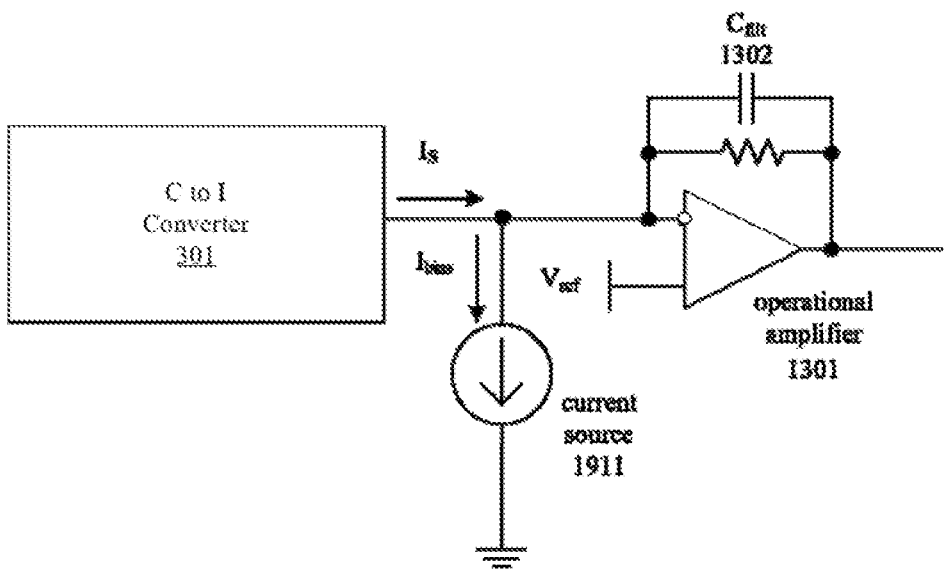
FIG. 19B illustrates base capacitance current compensation using a current source in a capacitance to current converter, according to one embodiment.

Alternative embodiments provide base-capacitance current compensation using a programmable current source or a resistor, as illustrated in FIGS. 18A, 18B, 19A, and 19B. More specifically, FIG. 18A illustrates base-capacitance current compensation using a resistor $R_{bias}$ 1801 as a current source in a capacitance-to-current converter, according to one embodiment. FIG. 18B illustrates base capacitance current compensation using a resistor $R_{bias}$ 1811 as a current sink in a capacitance-to-current converter, according to one embodiment. Current source 1901 and current source 1911 add and subtract current to and from the capacitance-to-current conversion circuits current onto $C_{int}$ 1302, respectively. FIG. 19A illustrates base-capacitance current compensation using a current source 1901 as a current sink in a capacitance-to-current converter, according to one embodiment. FIG. 19B illustrates base-capacitance current compensation using a current source 1911 in a capacitance-to-current converter, according to one embodiment. The $R_{bias}$ 1801 and $R_{bias}$ 1811 add and subtract current to and from the capacitance-to-current conversion circuits current onto $C_{int}$ 1302, respectively.

Figure 20A:
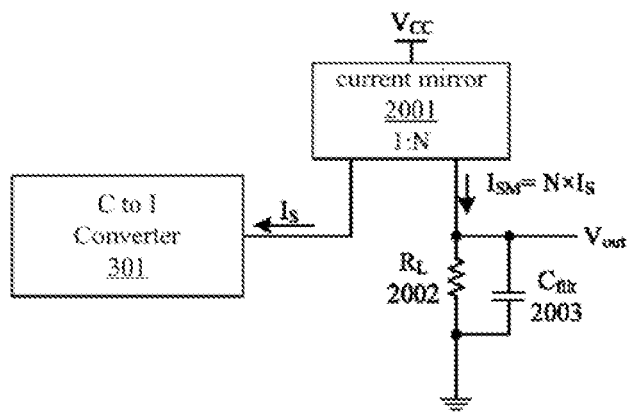
FIG. 20A illustrates using a current mirror with a voltage conversion system, according to one embodiment.
Figure 20B:
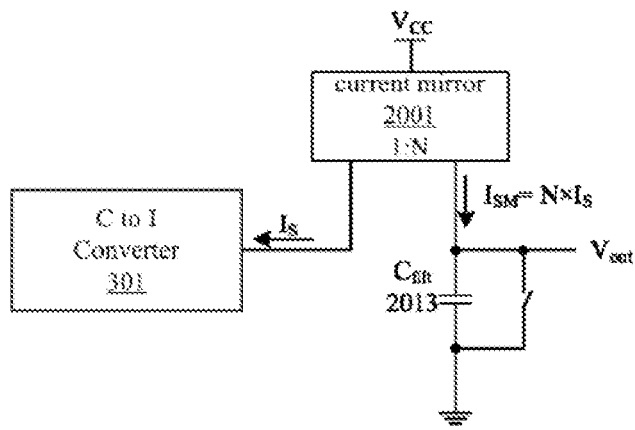
FIG. 20B illustrates using a current mirror with a current conversion system, according to one embodiment.
Figure 20C:
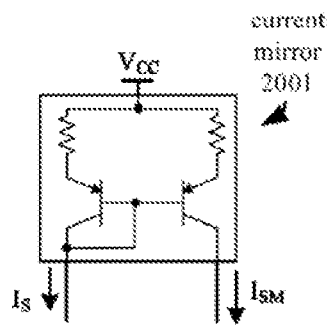
FIG. 20C illustrates one embodiment of a current mirror using a bipolar process technology.

FIGS. 20A, 20B, and 20C illustrate using a current mirror 2001 in the conversion circuits. FIG. 20A shows an example of a circuit for current-to-voltage conversion using a low-pass filter, formed by the combination of load resistance $R_L$ 2002 and filter capacitor $C_{filt}$ 2003. The current to voltage conversion is carrying out on the output of capacitance-to-current converter 301. A filter output voltage can be measured using an ADC, such as that shown FIG. 12 (element 1202). FIG. 20B illustrates a current-to-current conversion circuit. A current ($I_{SM}$) is sourced to the integration capacitor $C_{int}$ 2013 from current mirror 2001 which is coupled to and mirrors the current ($I_S$) of capacitance-to-current converter 301. The different circuits can be used for integration capacitor current measurement. In one embodiment, a current can be measured using a threshold comparator and a timer (not shown). In another embodiment, an integration capacitor voltage is measured using an ADC after running a capacitance-to-current operation within a predefined amount of time. The current mirror has low input impedance, which allows keeping a current mirror input pin voltage close to a constant voltage (e.g., $V_{DD}$). This embodiment may optimize the operating conditions of the capacitance-to-current conversion circuit, allowing the use of a voltage buffer with a smaller slew rate and reduced current consumption. Also, the current mirror serves as a current amplifier or attenuator, boosting or reducing the converter current by a factor of N. Many implementations of the current mirror circuit are possible, and one implementation using bipolar transistors is shown at FIG. 20C (element 2001). Equivalent circuits may be made with MOS, CMOS, and other circuit techniques.

Figure 21:
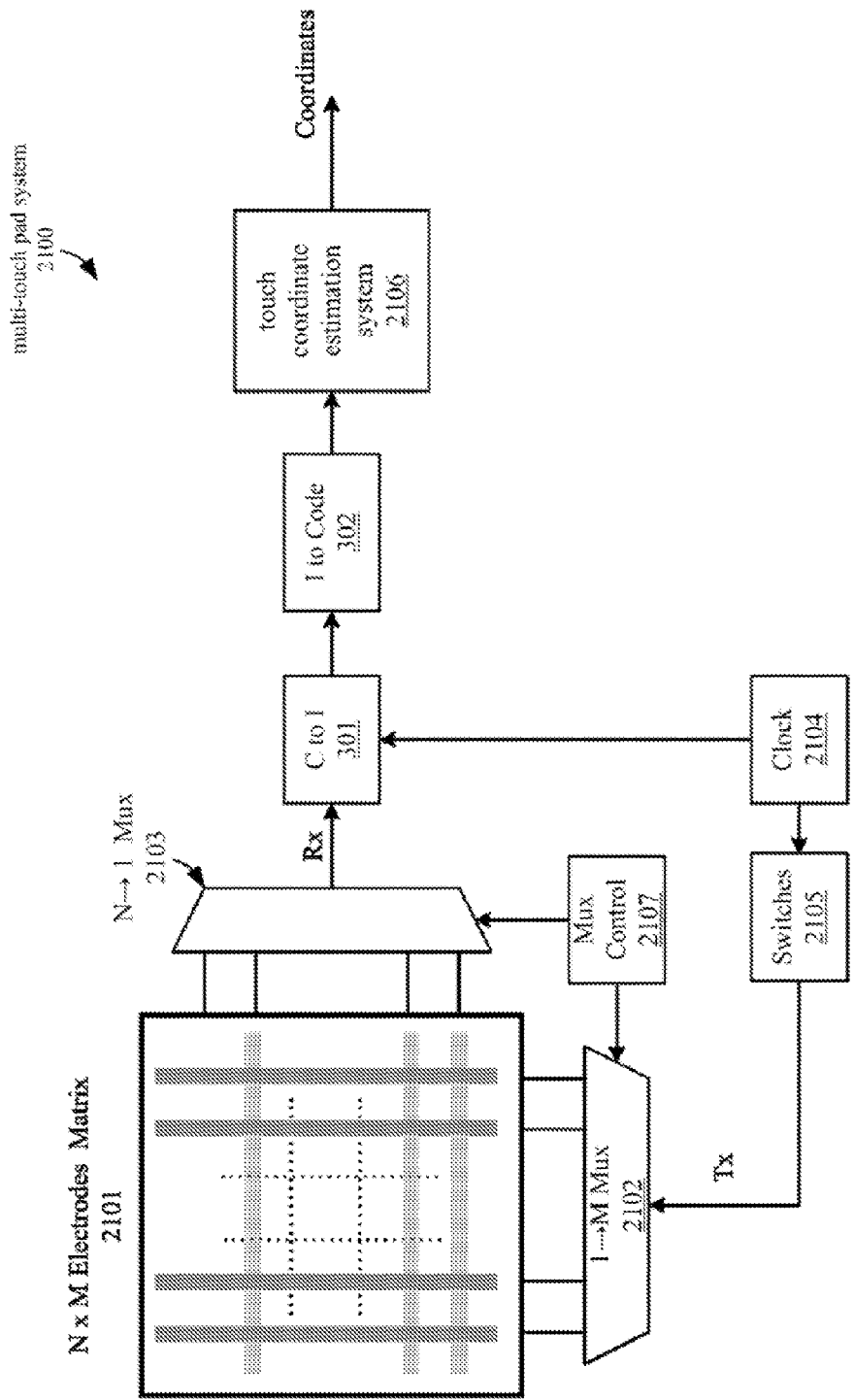
FIG. 21 illustrates one embodiment of a capacitance measurement circuit in a multi-touch touchpad system.

FIG. 21 illustrates a simplified schematic of a multi-touch touchpad system. The multi-touch touchpad system 2100 is composed of a dual dimension array (matrix) of electrodes 2101 coupled to column and row signal multiplexers 2102 and 2103. Multiplexor control 2107, clock source 2104, drive switches 2105 couple electrodes matrix 2101 to capacitance-to-current converter 301. Capacitance-to-current converter 301 is coupled to current-to-code converter 302. Current-to-code converter 302 is coupled to touch coordinate estimation system 2106. The electrodes matrix 2101 can be fabricated from any conductive material, as copper, conductive ink, Indium Tin Oxide (ITO), PEDOT, etc.

Figure 22:
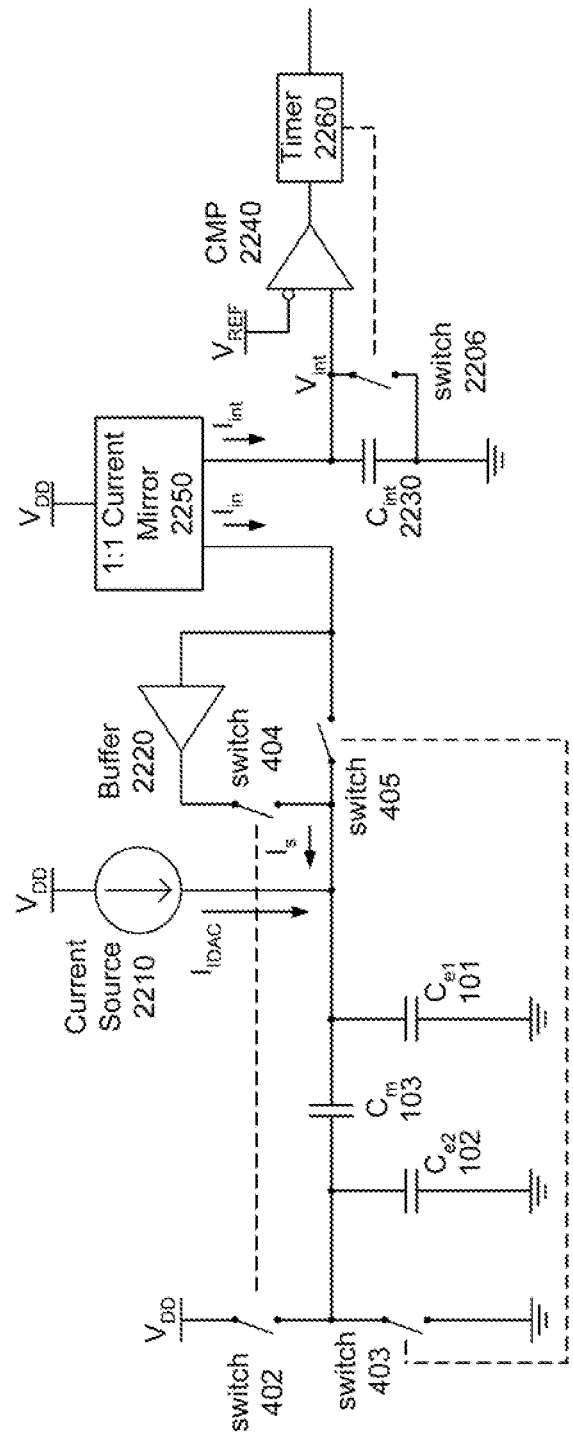
FIG. 22 illustrates one embodiment of a capacitance to current converter with a conversion circuit comprising a current mirror, an integration circuit and a timer.

FIG. 22 illustrates one embodiment of the capacitance-to-current converter comprising a current mirror 2250 and integration circuit ($C_{int}$ 2230, switch 2206 and CMP 2240) and a timer 2260.

Sensitivity and resolution of the capacitance measurement circuit are increased and the scan time is reduced with the addition of the compensating current Um generated by the programmable current supply IDAC 2210. The result summary current $I_{in}$ is generated and given by:

$$I_{in} = I_s - I_{IDAC} \tag{11}$$

Current mirror 2250 mirrors $I_{in}$ into $I_{int}$ with a transmission efficiency $K_1 = -1$. A reset switch on current integrator capacitor $C_{int}$, along with a timer 2260 and a comparator CMP 2240, digitize the current from current mirror 2250. Before measurement, the voltage on capacitor $C_{int}$ 2230 is reset to a reset potential by reset switch 2206. During operation, charge integration on $C_{int}$ 2230 increases the voltage across $C_{int}$ 2230 as:

$$U_{Cint} = I_{int} \cdot \frac{t_{int}}{C_{int}} \tag{12}$$

The voltage across $C_{int}$, $U_{Cint}$, reaches a threshold $V_{ref}$ on the comparator CMP 2240 input, causing a hold on timer 2260 which is started at the beginning of the charge integration. The output of the timer is a digital representation of the non-compensated capacitance of $C_m + C_F$. (wherein $C_F$ is the change in $C_m$ caused by the presence of a finger or other conductive object). The full equation for the conversion of capacitance to current to counts is given by:

$$T_x = \frac{U_{Vref}}{K_1(f_{sw} \cdot U_{Vdd} \cdot C_m - I_{IDAC} - f_{sw} \cdot U_{Vdd} \cdot C_f)} \cdot C_{int} \tag{13}$$

This timer output signal may be used to operate reset switch 2206. In an alternate embodiment, integration capacitor reset switch 2206 may be operated by a state-machine or under control of a CPU executing instructions. Before measuring, the timer register's values are configured to initial values. The integration time may be sampled by a timer clock signal with a period of $$T_{ref} = \frac{1}{f_{ref}} \tag{14}$$

The result of the value of the clock frequency cycle number in one integration cycle of the measured current is given by:

$$N_x = \frac{T_x}{T_{ref}} \pm 1 \tag{15}$$

In the foregoing specification, the invention has been described with reference to specific embodiments thereof. It will, however, be evident that various modifications and changes may be made thereto without departing from the broader spirit and scope of embodiments of the invention.

What is claimed is:

1. A capacitance measurement circuit, comprising:
a plurality of switches;
a first node coupled with a first electrode and coupled with at least a first switch of the plurality of switches; and
a second node coupled with a second electrode and coupled with at least a second switch of the plurality of switches, wherein the plurality of switches is configured to reduce an influence of a self-capacitance of the first electrode and a self-capacitance of the second electrode on an output signal during measurement of a mutual capacitance between the first electrode and the second electrode, and wherein the plurality of switches is configured to reduce an influence of the mutual capacitance on the output signal during measurement of at least one of the self-capacitance of the first electrode and the self-capacitance of the second electrode.

2. The capacitance measurement circuit of claim 1, further comprising an integration capacitor coupled with at least one of the plurality of switches, wherein the plurality of switches is further configured to transfer charge to the integration capacitor from at least one of the first electrode and the second electrode.

3. The capacitance measurement circuit of claim 2, wherein the plurality of switches is configured to reduce the influence of the self-capacitances by minimizing a potential difference between each of the first node and the second node and a terminal of the integration capacitor during at least one switching phase of the plurality of switches.

4. The capacitance measurement circuit of claim 2, wherein the plurality of switches is configured to reduce the influence of the mutual capacitance by applying a potential difference across the first electrode and the second electrode that is approximately equal to another potential difference between terminals of the integration capacitor during at least one switching phase of the plurality of switches.

5. The capacitance measurement circuit of claim 1, wherein the first node is coupled with a third switch of the plurality of switches and the second node is coupled with a fourth switch of the plurality of switches.

6. The capacitance measurement circuit of claim 5, wherein the first switch and the second switch are closed simultaneously, and wherein the third switch and the fourth switch are closed simultaneously according to a first switching sequence for operating the plurality of switches during the measurement of the at least one self-capacitance.

7. The capacitance measurement circuit of claim 5, wherein the first switch and the fourth switch are closed simultaneously, and wherein the second switch and the third switch are closed simultaneously according to a second switching sequence for operating the plurality of switches during the measurement of the mutual capacitance.

8. A capacitance measurement circuit, comprising:
a first node coupled with a first electrode;
a second node coupled with a second electrode capacitively coupled with the first electrode; and
a plurality of switches coupled with the first node and the second node and configured to reduce an influence of a mutual capacitance on an output signal by operating according to a first switching sequence during measurement of a self-capacitance for at least one of the first electrode and the second electrode, and configured to reduce an influence of the self-capacitance of the first electrode and the self-capacitance of the second electrode on the output signal by operating according to a second switching sequence different from the first sequence during measurement of the mutual capacitance between the first electrode and the second electrode.

9. The capacitance measurement circuit of claim 8, further comprising an output node coupled with at least one of the plurality of switches and configured to output the output signal based on a current generated by operation of the plurality of switches.

10. The capacitance measurement circuit of claim 8, further comprising an integration capacitor coupled with at least one of the plurality of switches, wherein the plurality of switches is further configured to transfer charge to the integration capacitor from at least one of the first electrode and the second electrode.

11. The capacitance measurement circuit of claim 10, wherein the plurality of switches is configured to reduce the influence of the mutual capacitance when operating according to the first switching sequence by applying a potential difference between the first electrode and the second electrode that is approximately equal to another potential difference between terminals of the integration capacitor during at least one switching phase of the plurality of switches.

12. The capacitance measurement circuit of claim 10, wherein the plurality of switches is configured to reduce the influence of the self-capacitances when operating according to the second switching sequence by minimizing a potential difference between each of the first node and the second node and a terminal of the integration capacitor during at least one switching phase of the plurality of switches.

13. The capacitance measurement circuit of claim 8, wherein the plurality of switches further comprises a third switch coupled with the first node and a fourth switch coupled with the second node, and wherein the first switch and the second switch are closed simultaneously, and wherein the third switch and the fourth switch are closed simultaneously according to a first switching sequence for operating the plurality of switches during the measurement of the at least one self-capacitance.

14. The capacitance measurement circuit of claim 8, wherein the plurality of switches further comprises a third switch coupled with the first node and a fourth switch coupled with the second node, and wherein the first switch and the fourth switch are closed simultaneously, and wherein the second switch and the third switch are closed simultaneously according to a second switching sequence for operating the plurality of switches during the measurement of the mutual capacitance.

15. A method, comprising:
operating a plurality of switches according to a first switching sequence to reduce an influence of a mutual capacitance between a pair of electrodes for a period of time during which a self-capacitance is measured for at least one of the pair of electrodes; and
operating the plurality of switches according to a second switching sequence to reduce an influence of self-capacitances for each of the pair of electrodes for a period of time during which the mutual capacitance between the pair of electrodes is measured.

16. The method of claim 15, further comprising storing charge generated by operation of the plurality of switches according to the first switching sequence and the second switching sequence in an integration capacitor coupled with at least one of the plurality of switches.

17. The method of claim 16, wherein minimizing the influence of the self-capacitances further comprises minimizing a potential difference between each of the pair of electrodes and a terminal of the integration capacitor during at least one switching phase of the plurality of switches.

18. The method of claim 16, wherein minimizing the influence of the mutual capacitance further comprises applying a potential difference between the first electrode and the second electrode that is approximately equal to another potential difference between terminals of the integration capacitor during at least one switching phase of the plurality of switches.

19. The method of claim 15, wherein operating the plurality of switches according to the first switching sequence further comprises:
closing a first switch and a second switch of the plurality of switches while a third switch and a fourth switch of the plurality of switches remain open; and
closing the third switch and the fourth switch, while the first switch and the second switch remain open.

20. The method of claim 15, wherein operating the plurality of switches according to the second switching sequence further comprises:
closing a first switch and a fourth switch of the plurality of switches while a second switch and a third switch of the plurality of switches remain open; and
closing the second switch and the third switch while the first switch and the fourth switch remain open.

* * * * *